US012749162B2

(12) United States Patent
Zhao et al.

(10) Patent No.: US 12,749,162 B2
(45) Date of Patent: Sep. 29, 2026

(54) SYSTEM AND METHOD FOR DENOISING IN MAGNETIC RESONANCE IMAGING

(71) Applicant: The Chinese University of Hong Kong, Shatin (CN)

(72) Inventors: Shutian Zhao, Tai'an (CN); Weitian Chen, Ma An Shan (CN)

(73) Assignee: The Chinese University of Hong Kong, Shatin (CN)

( * ) Notice: Subject to any disclaimer, the term of this patent is extended or adjusted under 35 U.S.C. 154(b) by 566 days.

(21) Appl. No.: 18/128,193

(22) Filed: Mar. 29, 2023

(65) Prior Publication Data

US 2023/0342885 A1 Oct. 26, 2023

Related U.S. Application Data

(60) Provisional application No. 63/325,105, filed on Mar. 29, 2022.

(51) Int. Cl.
*G06T 5/70* (2024.01)
*G01R 33/56* (2006.01)

(52) U.S. Cl.
CPC ............ *G06T 5/70* (2024.01); *G01R 33/5608* (2013.01); *G06T 2200/04* (2013.01); *G06T 2207/10088* (2013.01); *G06T 2207/20081* (2013.01); *G06T 2207/20084* (2013.01); *G06T 2207/30004* (2013.01)

(58) Field of Classification Search
None
See application file for complete search history.

(56) References Cited

U.S. PATENT DOCUMENTS

| | | | | |
|---|---|---|---|---|
| 11,348,226 | B2 * | 5/2022 | Ida | G01R 33/4818 |
| 2008/0262339 | A1 * | 10/2008 | Garwood | A61B 5/7285 600/413 |
| 2019/0285713 | A1 * | 9/2019 | Polak | G06N 20/00 |
| 2019/0347772 | A1 * | 11/2019 | Zhang | G01R 33/565 |
| 2020/0065969 | A1 * | 2/2020 | Huang | G06V 10/82 |

(Continued)

OTHER PUBLICATIONS

H. Zou, R. Lan, Y. Zhong, Z. Liu and X. Luo, "EDCNN: A Novel Network for Image Denoising," 2019 IEEE International Conference on Image Processing (ICIP), Taipei, Taiwan, 2019, pp. 1129-1133, doi: 10.1109/ICIP.2019.8804293.*

(Continued)

*Primary Examiner* — Jiangeng Sun
(74) *Attorney, Agent, or Firm* — Kilpatrick Townsend & Stockton LLP

(57) ABSTRACT

Denoising of magnetic resonance (MR) images can be achieved using a deep neural network and an image acquisition process that uses multi-NEX (Number of Excitations) or multi-NSA (Number of Signal Averages or Acquisitions) to produce two or more complex-valued images of a region of interest. The set of images resulting from the image acquisition process can be input to a deep neural network that has been trained to produce a denoised MR image from a set of multi-NEX or multi-NSA images. The deep neural network can be implemented using a two-dimensional or three-dimensional convolutional neural network to match the dimensionality of the input images. Training of the denoising neural network can use real MR images.

24 Claims, 19 Drawing Sheets
(9 of 19 Drawing Sheet(s) Filed in Color)

(56) References Cited

U.S. PATENT DOCUMENTS

| | | | | |
|---|---|---|---|---|
| 2020/0249306 | A1* | 8/2020 | Abdishektaei | G01R 33/482 |
| 2022/0198725 | A1* | 6/2022 | Litwiller | G01R 33/565 |
| 2023/0342886 | A1* | 10/2023 | Meyer | G06T 5/70 |

OTHER PUBLICATIONS

Buades, et al., "A non-local algorithm for image denoising," 2005 IEEE Computer Society Conference on Computer Vision and Pattern Recognition (CVPR'05). IEEE., vol. 2, pp. 60-65 (2005).

Dabov, et al., "Image Denoising by Sparse 3-D Transform-Domain Collaborative Filtering," IEEE Transactions on image processing, vol. 16(8), pp. 2080-2095 (2007).

Burger, et al., "Image denoising: can plain neural networks compete with BM3D?," 2012 IEEE conference on computer vision and pattern recognition, Providence, RI: IEEE, pp. 2392-2399n (2012).

Lin, et al., "Denoise MRI Images Using Sparse 3D Transformation Domain Collaborative Filtering," 2011 4th International Conference on Biomedical Engineering and Informatics (BMEI). IEEE, vol. 1, pp. 233-236 (2011).

Maggioni, et al.,"Nonlocal Transform-Domain Filter for Volumetric Data Denoising and Reconstruction," IEEE transactions on image processing. vol. 22(1), pp. 119-133 (2012).

Foi, "Noise Estimation And Removal In Mr Imaging: The Variance-stabilization Approach," 2011 IEEE International symposium on biomedical imaging: from nano to macro. IEEE., pp. 1809-1814 (2011).

Chang, et al., "Two-Stage Convolutional Neural Network For Medical Noise Removal Via Image Decomposition," IEEE Transactions on Instrumentation and Measurement., vol. 69(6), pp. 2707-2721 (2019).

Kim, et al., "Accurate Image Super-Resolution Using Very Deep Convolutional Networks," Proceedings of the IEEE conference on computer vision and pattern recognition., pp. 1646-1654 (2016).

Zhang, et al., "Beyond a Gaussian Denoiser: Residual Learning of Deep CNN for Image Denoising," IEEE transactions on image processing., vol. 26(7), pp. 3142-3155 (2017).

Jiang, et al., "Denoising of 3D magnetic resonance images with multi-channel residual learning of convolutional neural network," Japanese Journal of Radiology., pp. 566-574 (2017).

Kawamura, et al., "Accelerated Acquisition of High-resolution Diffusion-weighted Imaging of the Brain with a Multi-shot Echo-planar Sequence: Deep-learning-based Denoising," Magnetic Resonance in Medical Sciences, vol. 20(1), pp. 99-105 (2021).

Xie, et al., "Denoising arterial spin labeling perfusion MRI with deep machine learning," Magnetic resonance imaging, vol. 68, pp. 95-105 (2020).

Li, et al., "MRI denoising using progressively distribution-based neural network," Magnetic resonance imaging, vol. 71, pp. 55-68 (2020).

Ulas, et al., "DeepASL: Kinetic Model Incorporated Loss for Denoising Arterial Spin Labeled MRI via Deep Residual Learning," International conference on medical image computing and computer-assisted intervention, vol. 30-38 (2018).

Tripathi, et al., "CNN-DMRI: A Convolutional Neural Network for Denoising of Magnetic Resonance Images," Pattern Recognition Letters, vol. 135, pp. 57-63 (2020).

Sijbers, et al., "Quantification and Improvement of the Signal-to-Noise Ratio in a Magnetic Resonance Image Acquisition Procedure," Magnetic Resonance Imaging, vol. 14(10), pp. 1157-1163 (1996).

Ting, et al., "Automatic Noise Removal And Effect of NEX Setting on Magnetic Resonance Images," 2011 4th International Conference on Biomedical Engineering and Informatics (BMEI). IEEE, vol. 1, pp. 160-164 (2011).

Mcveigh, et al., "Noise and filtration in magnetic resonance imaging," Medical physics, vol. 12(5), pp. 586-591 (1985).

* cited by examiner

700

| | PSNR | | SSIM | |
|---|---|---|---|---|
| | 2NEX-avg | 2D-multiCH | 2NEX-avg | 2D-multiCH |
| axial | 31.1043±2.6417 | 33.4544±2.4321 | 0.86473±0.05759 | 0.91581±0.03581 |
| coronal | 33.2752±2.2388 | 35.8279±2.3827 | 0.91528±0.02548 | 0.94977±0.01524 |
| sagittal | 31.4160±2.2530 | 34.7236±2.1836 | 0.86614±0.03823 | 0.92463±0.02046 |

FIG. 7

1100

| | PSNR | | SSIM | |
|---|---|---|---|---|
| | Single-input | Dual-input | Single-input | Dual-input |
| 2NEX-avg | 31.4114±2.2761 | | 0.86612±0.03834 | |
| BM3D* | 32.1113±2.3824 | – | 0.88328±0.03340 | – |
| DnCNN* | 34.0181±2.2645 | – | 0.91976±0.02025 | – |
| DL_ASL | 34.0692±2.2068 | 34.4133±2.1456 | 0.92052±0.02125 | 0.92367±0.02047 |
| RicianNet | 34.0455±2.2154 | 34.5632±2.2042 | **0.92055±0.02066** | 0.92388±0.02031 |
| 2D-multiCH | **34.1432±2.2244** | **34.7233±2.2108** | 0.92054±0.02123 | **0.92459±0.02047** |

* BM3D and DnCNN only process single input.

*FIG. 11*

1200

| | PSNR | SSIM |
|---|---|---|
| 2D-multiCH | 34.7233±2.2108 | 0.92459±0.02047 |
| Model-Tra | 34.5816±2.2452 | 0.92308±0.02157 |
| Model-Res | 34.6493±2.1935 | 0.92320±0.02115 |

*FIG. 12*

1500

| Network | Input (channel) | Pattern1 | | Pattern2 | |
|---|---|---|---|---|---|
| | | 2DPSNR | 2DSSIM | 2DPSNR | 2DSSIM |
| - | 2-NEX | 26.2028± 4.2437 | 0.53011± 0.15405 | 23.6913± 4.2108 | 0.34089± 0.14926 |
| BM4D(Non-Blind) | 2-NEX(m) | 28.1662± 4.0706 | 0.74735± 0.15429 | 26.7590± 4.4300 | 0.69150± 0.18352 |
| BM4D(Blind) | 2-NEX(m) | 27.8815± 4.5208 | 0.66410± 0.13651 | 25.7404± 5.0711 | 0.51521± 0.16229 |
| 3D-Parallel-RicianNet | 2-NEX(i,r) | 34.8225± 4.3205 | 0.86832± 0.10019 | 33.0835± 3.9384 | 0.82966± 0.11751 |
| 3D-DnCNN | 2-NEX(i,r) | 36.0807± 3.9750 | 0.91350± 0.06334 | 34.8054± 3.9536 | 0.89185± 0.07518 |
| 3D-multiCH-avgIn | 2-NEX(i,r) | 36.5901± 4.1416 | 0.92804± 0.04168 | 35.0292± 3.9971 | 0.90322± 0.06628 |
| 3D-multiCH | NEX1,NEX2 (i,r) | **37.3466± 3.7340** | **0.93718± 0.04220** | **35.6785± 4.0382** | **0.90618± 0.07797** |

*FIG. 15*

1600

| Network | Input (channel) | Pattern1 | | Pattern2 | |
|---|---|---|---|---|---|
| | | 3DPSNR | 3DSSIM | 3DPSNR | 3DSSIM |
| - | 2-NEX | 24.4136± 1.2160 | 0.90695± 0.02380 | 22.8719± 1.0585 | 0.86446± 0.03132 |
| BM4D(Non-Blind) | 2-NEX(m) | 26.2488± 1.6305 | 0.93828± 0.01989 | 25.5213± 1.5551 | 0.91221± 0.02700 |
| BM4D(Blind) | 2-NEX(m) | 26.7278± 1.5259 | 0.93572± 0.01940 | 25.6559± 1.3997 | 0.90900± 0.02589 |
| 3D-Parallel-RicianNet | 2-NEX(i,r) | 33.2811± 1.2442 | 0.98222± 0.00468 | 32.5402± 0.9350 | 0.97833± 0.00423 |
| 3D-DnCNN | 2-NEX(i,r) | 34.1817± 1.0893 | 0.98556± 0.00361 | 33.8814± 0.8354 | 0.98457± 0.00243 |
| 3D-multiCH-avgIn | 2-NEX(i,r) | 34.6586± 1.0494 | 0.98707± 0.00334 | 34.0148± 0.8218 | 0.98517± 0.00225 |
| 3D-multiCH | NEX1,NEX2(i,r) | **35.2542± 0.8954** | **0.98928± 0.00217** | **34.8335± 0.7822** | **0.98783± 0.00189** |

*FIG. 16*

1800

| Plane | Metric | Input | DnCNN | | multiCH | |
|---|---|---|---|---|---|---|
| | | | 2D | 3D | 2D | 3D |
| Axial | 2DPSNR | 30.7479± 2.1561 | 33.2556± 2.1777 | 33.3283± 2.1475 | 33.4774± 2.1714 | **33.6691± 2.1982** |
| | 2DSSIM | 0.89228± 0.03140 | 0.93461± 0.01901 | 0.93604± 0.01890 | 0.93751± 0.01871 | **0.93982± 0.01856** |
| Coronal | 2DPSNR | 29.9654± 4.3004 | 32.2090± 4.4531 | 32.5139± 4.4997 | 32.6035± 4.4736 | **32.9677± 4.5611** |
| | 2DSSIM | 0.88429± 0.05804 | 0.92519± 0.04580 | 0.92631± 0.04627 | 0.92827± 0.04629 | **0.93242± 0.04242** |
| Sagittal | 2DPSNR | 32.9619± 3.3282 | 35.0984± 3.2047 | 35.2466± 3.1765 | 35.4369± 3.2947 | **35.6554± 3.2129** |
| | 2DSSIM | 0.90280± 0.04425 | 0.94393± 0.02537 | 0.94408± 0.02522 | 0.94499± 0.02638 | **0.94624± 0.02498** |

*FIG. 18*

1900

| Metrics | Input | DnCNN | | multiCH | |
|---|---|---|---|---|---|
| | | 2D | 3D | 2D | 3D |
| 3DPSNR | 31.7787± 1.8364 | 34.2075± 1.4552 | 34.3919± 1.4226 | 34.5350± 1.3933 | **34.8008± 1.5308** |
| 3DSSIM | 0.97807± 0.00796 | 0.98635± 0.00447 | 0.98679± 0.00428 | 0.98717± 0.00404 | **0.98769± 0.00431** |

*FIG. 19*

SYSTEM AND METHOD FOR DENOISING IN MAGNETIC RESONANCE IMAGING

CROSS-REFERENCE TO RELATED APPLICATION

This application claims the benefit of U.S. Provisional Application No. 63/325,105, filed Mar. 29, 2022, the disclosure of which is incorporated herein by reference.

BACKGROUND

This disclosure relates generally to magnetic resonance imaging (MRI) and more specifically to systems and methods for denoising in MRI.

Magnetic resonance imaging (MRI) is a noninvasive diagnostic technique that can allow assessments of the composition and state of various tissues. In an MRI procedure, a patient is placed in a strong longitudinal magnetic field (B0) that aligns nuclear spins of atoms in the patient's body, producing a net magnetization vector. RF pulses with magnetic field components (B1) transverse to the longitudinal field and frequencies tuned to the Larmor frequency of an isotope of interest (often $^{1}$H) are applied. These pulses can flip spins into a higher energy state, resulting in a transverse component to the magnetization vector. As these spins return to the ground state, responsive RF pulses from the patient's body can be detected. Based on the response to pulses, characteristics of the magnetization can be measured. Commonly used measurements include the spin-lattice relaxation time (T1), measurement of which is typically based on recovery of the longitudinal component of the magnetization vector, and the spin-spin relaxation time (T2), measurement of which is typically based on decay of the transverse component of the magnetization vector. Since different anatomical structures have different material compositions, quantification of T1 and/or T2 can provide information about the material composition of a structure being imaged, and particular pulse sequences can be optimized to quantify T1 or T2. Other characteristics of magnetization can also be measured.

Regardless of the particular characteristic(s), the MRI signals are typically processed to generate images (often referred to as "MR images") representing the measured characteristic(s) as a function of position within a region of interest. These images can be rendered visually using a color or gray scale, thereby allowing a clinician to assess the condition of tissues and/or organs by viewing the images. In some applications, MRI can be used to image a patient's joint, such as a knee, wrist, ankle, or other joint, and the MR images can facilitate diagnosis of soft-tissue injuries, arthritis, or other conditions that may affect a joint.

One challenge for MRI is that the signal-to-noise ratio is often low, making it difficult for the clinician to see features of interest in the MR images. Various techniques for denoising, or improving the signal-to-noise ratio, of MR images have been developed. Examples include: bilateral filtering (e.g., as described in C. Tomasi and R. Manduchi, "Bilateral filtering for gray and color images," *Sixth international conference on computer vision* (IEEE Cat. No. 98CH36271) IEEE (1998)); total variation (TV)-based regularization (e.g., as described in L. I. Rudin et al., "Nonlinear total variation based noise removal algorithms," *Physica D: nonlinear phenomena* 60.1-4:259-268 (1992)); nonlocal means (NLM) (e.g., as described in A. Buades et al., "A non-local algorithm for image denoising," 2005 *IEEE Computer Society Conference on Computer Vision and Pattern Recognition*

(CVPR'05), Vol. 2, IEEE (2005)); K-singular value decomposition (K-SVD) (e.g., as described in M. Aharon et al., "K-SVD: An algorithm for designing overcomplete dictionaries for sparse representation," *IEEE Transactions on signal processing* 54.11:4311-4322 (2006)); and Block Matching 3-D collaborative filtering (BM3D) (e.g., as described in K. Dabov et al., "Image denoising by sparse 3-D transform-domain collaborative filtering," *IEEE Transactions on image processing,* 16(8), 2080-2095 (2007)).

Another approach to denoising of MR images uses deep learning techniques, such as convolutional neural networks (CNNs). CNNs have shown the ability to learn a hierarchy of features, including noise features. A stack of nonlinear layers in the deep learning model makes it easier to predict residual differences between an input and a desired output, as compared to directly optimizing the original mapping. Conventional approaches assume that a noisy observation can be expressed as a combination of a clean image and noise and apply residual learning to approximate the residual noise. Examples include: K. Zhang et al., "Beyond a gaussian denoiser: Residual learning of deep CNN for image denoising," *IEEE transactions on image processing,* 26(7), 3142-3155 (2017); D. Jiang et al., "Denoising of 3D magnetic resonance images with multi-channel residual learning of convolutional neural network," *Japanese Journal of Radiology, pp.* 566-574 (2017); M. Kawamura et al., "Accelerated acquisition of high-resolution diffusion-weighted imaging of the brain with a multi-shot echo-planar sequence: deep-learning-based denoising," *Magnetic Resonance in Medical Sciences* 20.1:99 (2021); D. Xie et al., "Denoising arterial spin labeling perfusion MRI with deep machine learning," *Magnetic resonance imaging* 68:95-105 (2020); S. Li et al., "MRI denoising using progressively distribution-based neural network," *Magnetic resonance imaging* 71:55-68 (2021); C. Ulas et al., "DeepASL: Kinetic model incorporated loss for denoising arterial spin labeled MRI via deep residual learning," *International conference on medical image computing and computer-assisted intervention*, Springer, Cham (2018); and P. C. Tripathi and S. Bag, "CNN-DMRI: a convolutional neural network for denoising of magnetic resonance images [J]," *Pattern Recognition Letters* 135:57-63 (2020).

The foregoing examples operate on individual 2D MR image slices. However, 3D MR images intrinsically include through-plane correlations, i.e., the property that pixels in the same location in adjacent image slices are similar. Accordingly, 3D denoising techniques have been developed to exploit these correlations. Examples of traditional denoising methods include: the spatial domain method (NLM) (Coupé et al., "An optimized blockwise nonlocal means denoising filter for 3-d magnetic resonance images," *IEEE Trans. Med. Imag.*, vol. 27, no. 4, pp. 425-441 (2008); J. V. Manjón et al., "Adaptive non-local means denoising of mr images with spatially varying noise levels," *J. Magn. Reson. Imag.*, vol. 31, no. 1, pp. 192-203 (2010)); transform domain method using discrete cosine transform (DCT) (J. Manjón et al., "New methods for MRI denoising based on sparseness and self-similarity," *Medical image analysis,* 16(1), 18-27 (2020)); and sparse representation method using singular value decomposition (SVD) (H. Lv and R. Wang, "Denoising 3d magnetic resonance images based on low-rank tensor approximation with adaptive multi-rank estimation," *IEEE Access*, vol. 7, pp. 85 995-86 003 (2019)). Representative of the state of the art is block matching with 4D filtering (BM4D), which is the 3D version of the transform domain method BM3D mentioned above (described in M. Maggioni et al., "Nonlocal transform-domain filter for volumetric data denoising and reconstruction," *IEEE transactions on image processing,* 22(1), 119-133 (2012)). BM4D can directly handle Rician noise and shows good performance in denoising MR images by applying a variance stabilizing transformation before denoising.

Deep learning techniques for 3D images have also been explored. In one general approach, multiple slices can be stacked along the channel axis of a 2D neural network. Examples of this approach include "McDnCNN" (D. Jiang, et al., "Denoising of 3D magnetic resonance images with multi-channel residual learning of convolutional neural network," *Japanese journal of radiology,* 36(9), 566-574 (2018)) and "DABN" (Y. Xu et al., "Deep Adaptive Blending Network for 3D Magnetic Resonance Image Denoising," *IEEE Journal of Biomedical and Health Informatics,* 25(9), 3321-3331 (2021)). These networks denoise the central slice of a 3D MR volume defined by a group of 5 adjacent slices. The multi-channel 2D networks can reduce memory costs compared to a complete 3D model; however, since these models merely learn weighted features of neighboring slices to the central layer, they do not take full advantage of through-plane information.

A 3D CNN learns in three dimensions using 3D operations, including 3D convolution, 3D pooling, 3D batch normalization (BN), etc. A few efforts have been made to apply a 3D CNN to denoising of MR images. Examples include: "PRI-PB-CNN," a 9-layer 3D CNN to denoise Gaussian and Rician noise (described in J. V. Manjón, &P. Coupé, "MRI denoising using deep learning," in *International Workshop on Patch-based Techniques in Medical Imaging* (pp. 12-19). Springer, Cham. (September 2018)); a 5-layer network "3D-WRN-VGG" for Rician noise (described in A. Panda et al., "A 3D wide residual network with perceptual loss for brain MRI image denoising," in 2019 10*th International Conference on Computing, Communication and Networking Technologies* (*ICCCNT*) (pp. 1-7), IEEE (July 2019)); the RED-WGAN with an autoencoder generator (described in M. Ran, et al., "Denoising of 3D magnetic resonance images using a residual encoder-decoder Wasserstein generative adversarial network," *Medical image analysis,* 55, 165-180 (2019)). It has been shown that a parallel CNN structure with normal and dilated convolutions can suppress both Gaussian-impulse noise and Rician noise in MR images. (See H. Aetesam & S. K. Maji, "Noise dependent training for deep parallel ensemble denoising in magnetic resonance images," *Biomedical Signal Processing and Control,* 66, 102405 (2021); L. Wu et al., "Denoising of 3D Brain MR Images with Parallel Residual Learning of Convolutional Neural Network Using Global and Local Feature Extraction," *Computational Intelligence and Neuroscience,* 2021 (2021)).

SUMMARY

Training of neural networks can be challenging due to limits on available image data. A typical approach involves generating synthetic image data with a given noise variance over the entire image. If the underlying assumption of noise variance is incorrect, there may be systematic differences between synthetic images and real (clinical) images, and the denoising performance of the neural network may be degraded. In addition, conventional methods do not account for multi-channel information or for correlations that may be present in MR images from multiple-NEX (Number of EXcitations), or multiple-NSA (Number of Signal Averages or Acquisitions) acquisitions. Accordingly, further improvement in denoising of MR images is desirable.

Certain embodiments of the present invention relate to systems and methods for denoising magnetic resonance (MR) images using a denoising neural network and an image acquisition process that uses multiple NEX (greater than or equal to 2) to produce a set of two or more images (which can be complex-valued images) of a region of interest. The set of images resulting from the image acquisition process can be input to a denoising system that incorporates a deep learning neural network that has been trained to produce a denoised MR image from a set of multiple-NEX images. The deep learning neural network can incorporate a convolutional neural network (CNN), which can be a 2D or 3D convolutional neural network. In some embodiments, the denoising system can accept a pair of 2-NEX images (or a higher number of multi-NEX images) as input and perform residual learning, with the average of the input images being applied for skip connections.

In some embodiments, residual learning within the denoising neural network can proceed in two stages. In the first stage, a first (coarse) residual difference map is calculated and a skip connection is built on the average input image, thereby producing an intermediate residual-learning (RL) output map. In the second stage, features from all of the input images and the intermediate RL output map are used to generate a second (refined) residual difference map. The final output can be obtained from the second-stage residual difference map with a skip connection to the intermediate residual output. This structure allows the network to use both the strengthened signal and the inherent noise information from 2-NEX (or more generally multi-NEX) images.

In some embodiments, training of the denoising neural network can use real MR images. For example, to support supervised learning, training data can be obtained using a 2-NEX acquisition process, and ground truth for the training data can be established by imaging the same subject using a higher-NEX acquisition process (e.g., 8-NEX). After training, images acquired using a 2-NEX acquisition process can be denoised using the denoising system.

Some embodiments relate to a method for generating a magnetic resonance (MR) image. The method can include: obtaining a set of two or more input images from a magnetic resonance imaging (MRI) system wherein the input images are obtained using a multi-NEX or multi-NSA protocol and the set of input images includes a number of images equal to the number of NEX or NSA; inputting the set of input images to a denoising neural network that has been trained to perform denoising on a set of input images; and obtaining a denoised output image from the denoising neural network.

Some embodiments relate to a magnetic resonance imaging (MRI) system that can include an MRI apparatus having a magnet, a gradient coil, and one or more radiofrequency (RF) coils; and a computer communicably coupled to the MRI apparatus, the computer having a processor, a memory, and a user interface. The processor can be configured to: obtain a set of two or more input images from the magnetic resonance imaging (MRI) apparatus, wherein the input images are obtained using a multi-NEX or multi-NSA protocol and the set of input images includes a number of images equal to the number of NEX or NSA; input the set of images to a denoising neural network that has been trained to perform denoising on a set of input images; and obtain a denoised output image from the denoising neural network. In some embodiments, the processor cam further configured to acquire the images by operating the MRI apparatus to perform a rapid low-signal-to-noise-ratio multi-NEX acquisition. Three-dimensional Fast Spin Echo acquisition or other acquisition protocols can be used.

Some embodiments relate to a computer-readable storage medium having stored thereon program code instructions that, when executed by a processor in a computer communicably coupled to a magnetic resonance imaging (MRI) apparatus, cause the processor to perform a method that includes: obtaining a set of two or more input images from a magnetic resonance imaging (MRI) system wherein the input images are obtained using a multi-NEX or multi-NSA protocol and the set of input images includes a number of images equal to the number of NEX or NSA; inputting the set of images to a denoising neural network that has been trained to perform denoising on a set of input images; and obtaining a denoised output image from the denoising neural network.

In these and other embodiments, the NEX or NSA can be exactly two, in which case the set of images includes exactly two images. Alternatively, the NEX or NSA can be greater than two, in which case the set of images includes more than two images.

In these and other embodiments, the input images can be either two-dimensional (2D) images or three-dimensional (3D) images. For 2D images, the denoising neural network can use one or more convolutional neural networks with 2D kernels, and for 3D images, the denoising neural network can use one or more convolutional neural networks with 3D kernels.

In these and other embodiments, the input images can be complex-valued images, and the denoising neural network can process the real and imaginary parts of each input image as separate channels.

In these and other embodiments, the denoising neural network can include two stages of residual learning. In a first stage, a first residual difference map can be calculated, and a skip connection can be built on an average of the set of input images, thereby producing an intermediate residual-learning output map. In a second stage, features extracted from all of the input images and the intermediate residual-learning output map can be used to generate a second residual difference map. The denoised output image can be obtained from the second residual difference map and the intermediate residual-learning output map. In some embodiments with two stages of residual learning, the denoising neural network can include: a feature extraction module comprising a first plurality of convolutional layers that generate a first feature map from the input images; a transporting convolutional layer that operates on the first feature map to produce a noise feature map; a first residual convolutional layer that operates on the first feature map to produce a first-stage residual difference map; a first skip connection built by combining the first-stage residual difference map with an average image generated from the set of input images to produce an intermediate residual-learning output; one or more feature mapper convolutional layers that operate on the intermediate residual-learning output to produce a residual filter feature map; a consolidation layer that consolidates the noise feature map and the residual filter feature map; a plurality of convolutional layers that operate on an output of the consolidation layer to produce a second-stage residual difference image; and a second skip connection built by combining the second-stage residual difference image and the intermediate residual-learning output to produce the denoised output image.

In these and other embodiments, the denoising neural network using a training data set comprising real MR images and/or synthetic MR images with high signal-to-noise ratio. For instance, the training data set can include training images obtained using 2-NEX acquisitions and corresponding ground truth images obtained using multi-NEX acquisitions with NEX greater than 2, such as 8-NEX images.

The following detailed description, together with the accompanying drawings, will provide a better understanding of the nature and advantages of the claimed invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 7 shows a table comparing performance metrics for denoising using a conventional averaging technique and using a technique according to an embodiment.

FIG. 11 shows a table of performance metrics for denoising using conventional techniques and using a technique according to an embodiment.

FIG. 12 shows a table of performance metrics for denoising according to various embodiments.

FIGS. 15 and 16 are tables showing performance metrics for various denoising methods applied to synthesized MR images, including conventional techniques and techniques according to various embodiments.

FIGS. 18 and 19 are tables showing performance metrics for various denoising techniques applied to real MR images, including conventional techniques and techniques according to various embodiments.

DETAILED DESCRIPTION

The following description of exemplary embodiments of the invention is presented for the purpose of illustration and description. It is not intended to be exhaustive or to limit the invention to the precise form described, and persons skilled in the art will appreciate that many modifications and variations are possible. The embodiments have been chosen and described in order to best explain the principles of the invention and its practical applications to thereby enable others skilled in the art to best utilize the invention in various embodiments and with various modifications as are suited to the particular use contemplated.

Figure 1:
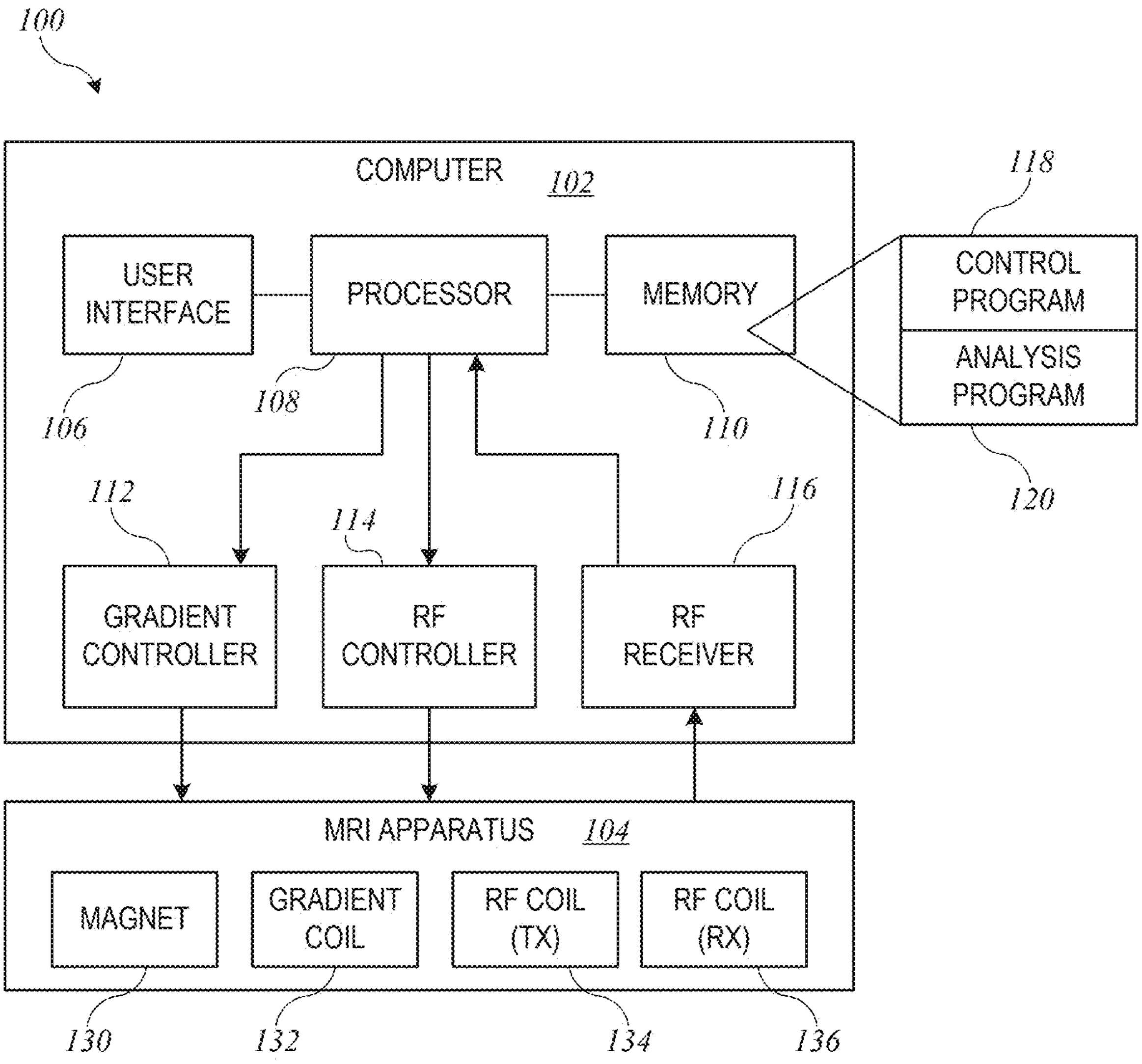
FIG. 1 shows an MRI system that can be used in connection with practicing some embodiments.

FIG. 1 shows an MRI system that can be used in connection with practicing some embodiments of the present invention. MRI system 100 includes a computer 102 communicably coupled to an MRI apparatus 104.

Computer 102 can be of generally conventional design and can include a user interface 106, a processor 108, a memory 110, a gradient controller 112, an RF controller 114, and an RF receiver 116. User interface 106 can include components that allow a user (e.g., an operator of MRI system 100) to input instructions or data and to view information. For example, user interface 106 can include a keyboard, mouse, joystick, display screen, touch-sensitive display screen, and so on. Processor 108 can include a general purpose programmable processor (or any other processor or set of processors) capable of executing program code instructions to perform various operations. Memory 110 can include a combination of volatile and nonvolatile storage elements (e.g., DRAM, SRAM, flash memory, magnetic disk, optical disk, etc.). Portions of memory 110 can store program code to be executed by processor 108. Examples of the program code can include a control program 118, which can coordinate operations of MRI apparatus 104 as described below in order to acquire data, and an analysis program 120, which can perform analysis algorithms on data acquired from MRI apparatus 104 (e.g., as described below). Gradient controller 112, RF controller 114, and RF receiver 116 can incorporate standard communication interfaces and protocols to communicate with components of MRI apparatus 104 as described below.

MRI apparatus 104 can be of generally conventional design and can incorporate a magnet 130, a gradient coil 132, and RF coils 134, 136. Magnet 130 can be a magnet capable of generating a large constant magnetic field B0 (e.g., 1.5 T, 3.0 T, or the like) in a longitudinal direction, in a region where a patient (or other subject to be imaged) can be placed. Gradient coil 132 can be capable of generating gradients in the constant magnetic field B0; operation of gradient coil 132 can be controlled by computer 102 via gradient controller 112. RF coils 134, 136 can include a transmitter (TX) coil 134 and a receiver (RX) coil 136. In some embodiments, a single coil can serve as both transmitter and receiver. In some embodiments, RF transmitter coil 134 can be placed around the portion of the subject's body that is to be imaged while RF receiver coil 136 is placed elsewhere within MRI apparatus 104. The preferred placement of RF coils 134, 136 may depend on the specific portion of the body that is to be imaged; those skilled in the art with access to the present disclosure will be able to make appropriate selections.

In operation, computer 100 can drive gradient coil 132 using gradient controller 112 to shape the magnetic field around the region being imaged. Computer 100 can drive RF transmitter coil 134 using RF controller 114 to generate RF pulses at a desired frequency (e.g., a resonant frequency for an isotope of interest), driving nuclear spins into an excited state. RF receiver coil 136 can detect RF waves generated by the spins relaxing from the excited state when RF pulses are not being generated. RF receiver 116 can include amplifiers, digital-to-analog converters, and other circuitry to generate digital data from the RF waves detected by RF receiver coil 136. RF receiver 116 can provide this data to processor 108 for analysis.

MRI system 100 is illustrative, and many variations and modifications are possible. Those skilled in the art will be familiar with a variety of MRI apparatus and control systems and with basic principles of MRI data acquisition, including the use of gradient fields and RF pulses, as well as techniques for detecting signals responsive to RF pulses and processing those signals to generate images. As used herein, an "image" or "MR image," can refer to any data structure that indicates a value of a parameter at each of a set of positions in a two-dimensional (2D) or three-dimensional (3D) space. The parameter can include any parameter that can be extracted or computed from magnetic resonance signals and can be a real-valued or complex-valued parameter.

In some embodiments, MRI system 100 or other MRI apparatus can be used to generate pulse sequences suitable for MR imaging of a subject, such as a specific joint, organ, or tissue within a patient. A variety of pulse sequences and signal acquisition techniques can be used, including 2D or 3D Fast Spin Echo (FSE). Preparatory pulse sequences can be applied as desired. Analysis of the resulting data to generate MR images can proceed using various reconstruction techniques, such as Sensitivity Encoding (SENSE), GeneRalized Autocalibrating Partial Parallel Acquisition (GRAPPA), and other techniques known in the art.

Depending on the particular implementation, MR images can be provided as either 2D images (typically a grid of pixels, which can be squares or rectangles, having a parameter value associated with each pixel) or 3D images (typically a three-dimensional array of voxels, which can be cubes or rectangular cuboids, having a parameter value associated with each voxel). The parameter can be, for instance, a detected RF signal that can have a complex value representing amplitude and phase.

In embodiments described herein, to facilitate denoising of images, MRI system 100 can perform time integration, e.g., by applying multiple NEX (Number of EXcitations) to generate multiple images. The NEX, or NSA (Number of Signal Averages/Acquisitions), specifies the number of images. For example, a 2-NEX acquisition produces two images; an 8-NEX acquisition produces eight images.

In a conventional approach to denoising using multi-NEX acquisition, the sum (or average) of the images is used as a signal-enhanced image, and the difference of the images used as a noise map. Signal-to-noise ratio (SNR) can be quantified as ratio of the mean signal to the standard deviation of noise, and increasing the NEX improves SNR in a manner roughly proportional to √NEX. Since each NEX adds a time penalty (taking longer to acquire the data), optimizing NEX generally involves tradeoffs between image quality and acquisition time.

It is conventionally assumed that the real and imaginary parts of the original signal from a single-coil MR acquisition include uncorrelated zero-mean and equal-variance Gaussian noise in the frequency domain. After applying a (complex-valued) Fourier transformation, the Gaussian characteristics of noise in the real and imaginary images, denoted herein by $N(0,\Gamma_0^2)$, are preserved. Consequently, if the MR acquisition is repeated to obtain a second complex image, then arithmetic can be performed on the two complex images, as the signals can be assumed to be the same. Specifically, a (complex-valued) signal-strengthened map (or image) can be obtained by summing the MR image data from the two acquisitions, and a (complex-valued) noise map can be obtained by subtracting the MR image data from the two acquisitions. The real and imaginary components of the signal-strengthened map and the noise map continue to exhibit a Gaussian noise distribution, denoted by $N(0, \sigma^2)$, where $\sigma=\sqrt{2}\sigma_0$. The magnitude image of the signal-strengthened map follows a Rician distribution and approximates a Gaussian distribution when the signal is sufficiently high. In contrast, the magnitude image of the noise map follows a Rayleigh distribution, with the mean and variance given by Eq. (1), as follows:

$$\mu_R = \sigma\sqrt{\frac{\pi}{2}}\text{; and} \tag{1}$$

$$\sigma_R^2 = \left(2 - \sqrt{\frac{\pi}{2}}\right)\sigma^2.$$

Phased array coils with multiple coil elements, in which the complex Gaussian assumption of noise is valid in each coil in the frequency domain, are commonly used in MRI. If the k-space is fully sampled, the final composite magnitude image is expected to follow a Rayleigh distribution or a noncentral chi (nc−$\chi$) distribution in the background noise-only region in the absence of noise correlations.

Figure 2:
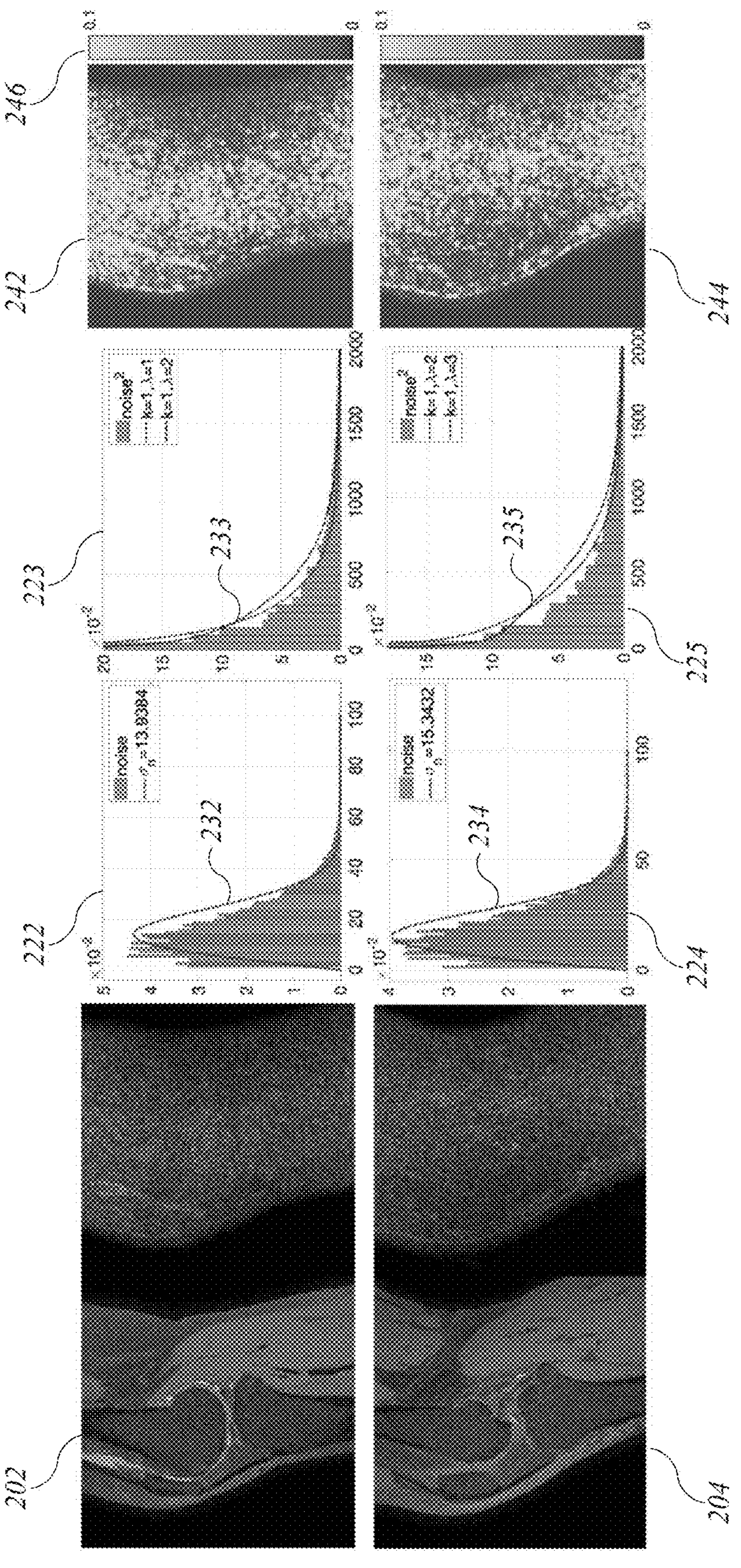
FIG. 2 shows observed examples of noise distributions for 3D FSE MRI.

However, in addition to non-negligible noise correlations in phased array coil systems, the commonly employed k-space undersampling and reconstruction algorithms used in fast MRI also increase the complexity of noise distributions. By way of illustration, FIG. 2 shows examples of noise distributions for 3D FSE MRI. MR images were acquired using an eight-channel knee coil with 2-NEX 3D FSE and a SENSE acceleration factor of 2. Signal-strengthened magnitude images 202, 204 were obtained by adding the 2-NEX images. Noise maps 212, 214 were obtained by subtracting the 2-NEX images. Noise histograms 222-225 were calculated from noise maps 212, 214. Histograms 222 and 224 show the magnitude of noise; histograms 223 and 225 show the square of the noise. Curves 232-235 were obtained by fitting a Rayleigh distribution to the histograms. It is expected that if the noise follows an nc−$\chi$ distribution, its square will follow a noncentral chi-squared (nc−$\chi^2$) distribution. However, as FIG. 2 shows, the noise has a non-stationary pattern that does not exactly follow either a simple Rayleigh distribution or an nc−$\chi$ distribution. Noise variance maps 242, 244 show the calculated local variance of the noise maps in patches of 3×3 pixels, using a color scale shown at 246. Spatial variation in the noise variance is evident This analysis suggests that noise is non-stationary in a given set of MR images. Accordingly, it may be advantageous to use real MR images with a true noise distribution, rather than simple synthetic noise, to train a denoising network. Examples of training using true noise distributions are described below.

Denoising System Using Deep Learning Neural Network

According to some embodiments of the present invention, MRI system 100 or other MRI systems can be used to perform 2-NEX (or higher-NEX) image acquisition, which can produce a set of images equal in number to the number of excitations. These images can be used directly as the inputs to a denoising neural network that outputs a denoised image. Depending on implementation, the denoising neural network can operate on 2D images (e.g., individual image slices) or 3D images (e.g., a stack of image slices parallel to a particular plane, such as the axial, coronal, or sagittal plane).

The denoising neural network can be a deep learning network designed to receive sets of input images (i.e., multiple images of the same region of interest, such as the two images produced in a 2-NEX acquisition) and produce a denoised output image. "Deep learning" neural networks include multiple layers of nodes, with the first layer operating on an input data sample and subsequent layers operating on outputs of one or more previous layers. The output of the network is the output of the last layer. Each node computes an output that is a weighted combination of its inputs, and each layer can include any number of nodes. (Nodes in the same layer operate independently of each other.) The output of a node can further be conditioned using techniques such as batch normalization (BN) and selection of a non-linear activation function, which are known in the art. In some embodiments described below, a rectified linear unit (ReLU) activation function is applied in some or all layers; other activation functions such as sigmoid activation can be used if desired. In some embodiments, the denoising neural network can include one or more convolutional neural networks (CNN), which are neural networks in which the weights in a layer are associated with a kernel function that can be convolved with inputs such pixels or voxels of an image. (Such layers are referred to as "convolutional layers.") A CNN can include one or more layers. In addition, the denoising neural network can incorporate a residual learning (RL) component that involves adding skip connections to a convolution block to connect low-level features directly to high-level representations. The network structure—including the number of layers, number of nodes in each layer, and the combination operation performed by each node—is generally fixed in advance.

Where the input images are 2D images, the denoising neural network can use 2D convolutional layers corresponding to a 2D kernel filter with learnable weights. Where the input images are 3D images, the denoising neural network can use 3D convolutional layers corresponding to a 3D kernel filter with learnable weights.

In some embodiments, the denoising neural network can incorporate a feature extraction module, a bridge module, and an assembly module. These modules can extract, integrate, and transfer the features of the input images. The denoising neural network can have a structure that enables two-stage residual learning to learn the inherent real noise distribution in a 2-NEX acquisition. In the first stage, a coarse residual difference map is calculated, and a skip connection is built on the average input image, thereby producing an intermediate residual output. In the second stage, features from all of the input images and the intermediate residual output are used to generate a more refined residual difference map. The final output can be obtained from the second-stage residual difference map with a skip connection to the intermediate residual output. This structure allows the network to use both the strengthened signal and the inherent noise information from 2-NEX (or more generally multi-NEX) images.

Figure 3:
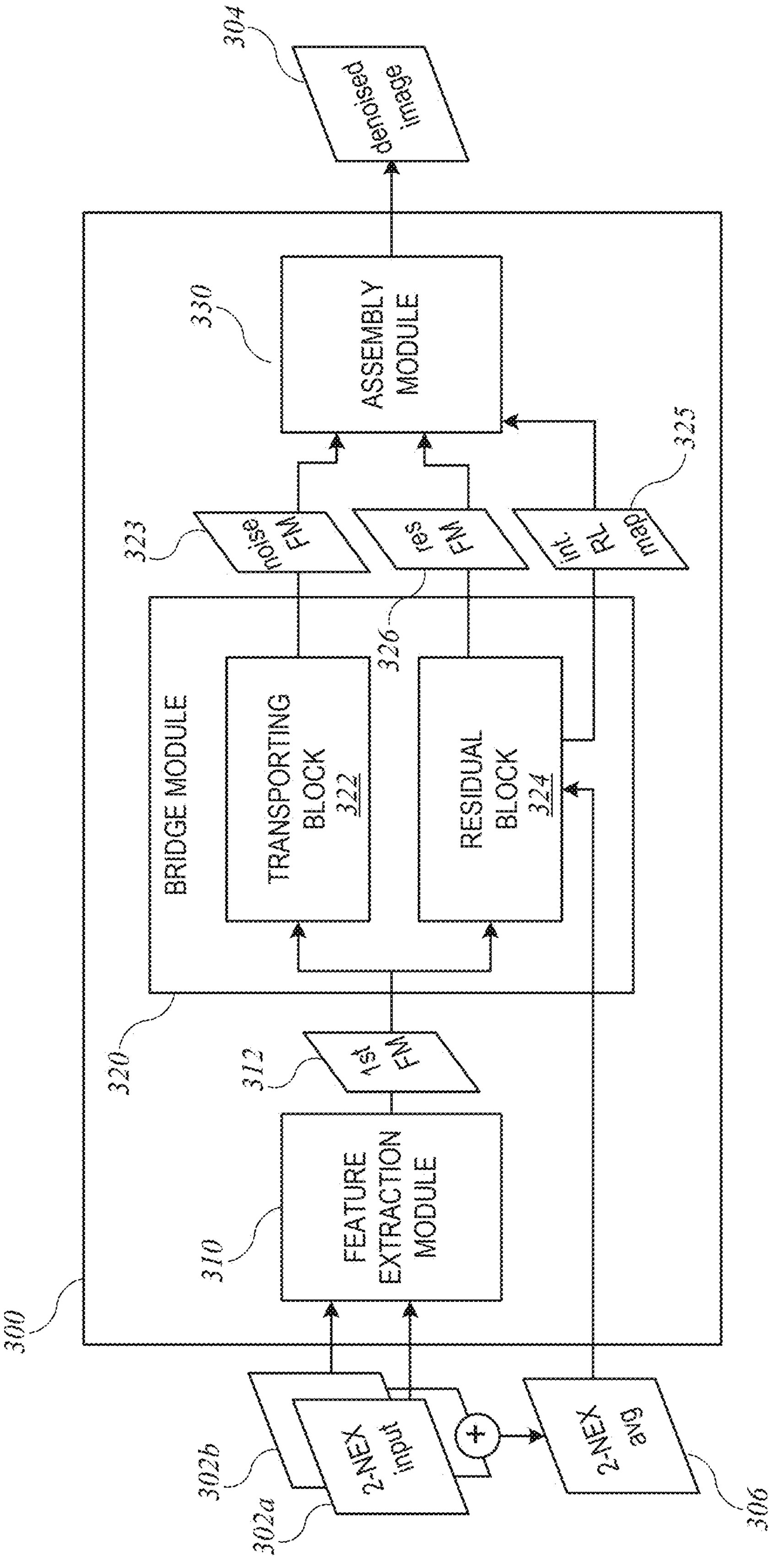
FIG. 3 shows a high-level workflow diagram for a denoising neural network system according to some embodiments.

FIG. 3 shows a high-level workflow diagram for a denoising system 300 according to some embodiments. Denoising system 300 includes a denoising neural network that can be trained to produce a denoised output image 304 from a pair of 2-NEX images 302*a*, 302*b* (which can be 2D images or 3D images, depending on the particular implementation). In the example shown, an average image 306 is also computed from the 2-NEX images 302*a*, 302*b* and provided as an additional input. As described below, the average image can be used to support residual learning in an intermediate stage of the denoising neural network. In some alternative embodiments, average image 306 can be used as the input in place of images 302*a*, 302*b*, in addition to being used to support residual learning in the intermediate stage of the denoising neural network. The denoising neural network of denoising system 300 includes a feature extraction module 310, a bridge module 320, and an assembly module 330.

Separate input and processing channels can be defined to treat different aspects of the image data. For instance, for complex-valued image data, one channel can correspond to the real part and one channel to the imaginary part. For multiple complex-valued input images, each image can be treated as providing two channels (a real part and an imaginary part); thus, where the input is a pair of 2-NEX images, the input channel count would be 4, which supports separate processing of the real and imaginary parts of each image. Where the input is only the average of 2-NEX images, the input channel count would be 2. Other input channel counts can be used, e.g., if multi-NEX images with NEX greater than 2 are input.

Feature extraction module 310 can include a number of convolutional layers (e.g., six layers) with a fixed-size kernel and can extract certain low-level features of the noise from the 2-NEX input images 302*a*, 302*b*, producing a first feature map 312.

Bridge module 320 can further refine the noise features using two parallel blocks: a transporting block 322 and a residual block 324, each operating on the first feature map 312. Transporting block 322 can include a convolutional layer with batch normalization to maintain the flow of the original 2-NEX input information. The output of transporting block 322 can be a noise feature map 323 that primarily inherits noise features from feature extraction module 310.

Figure 4:
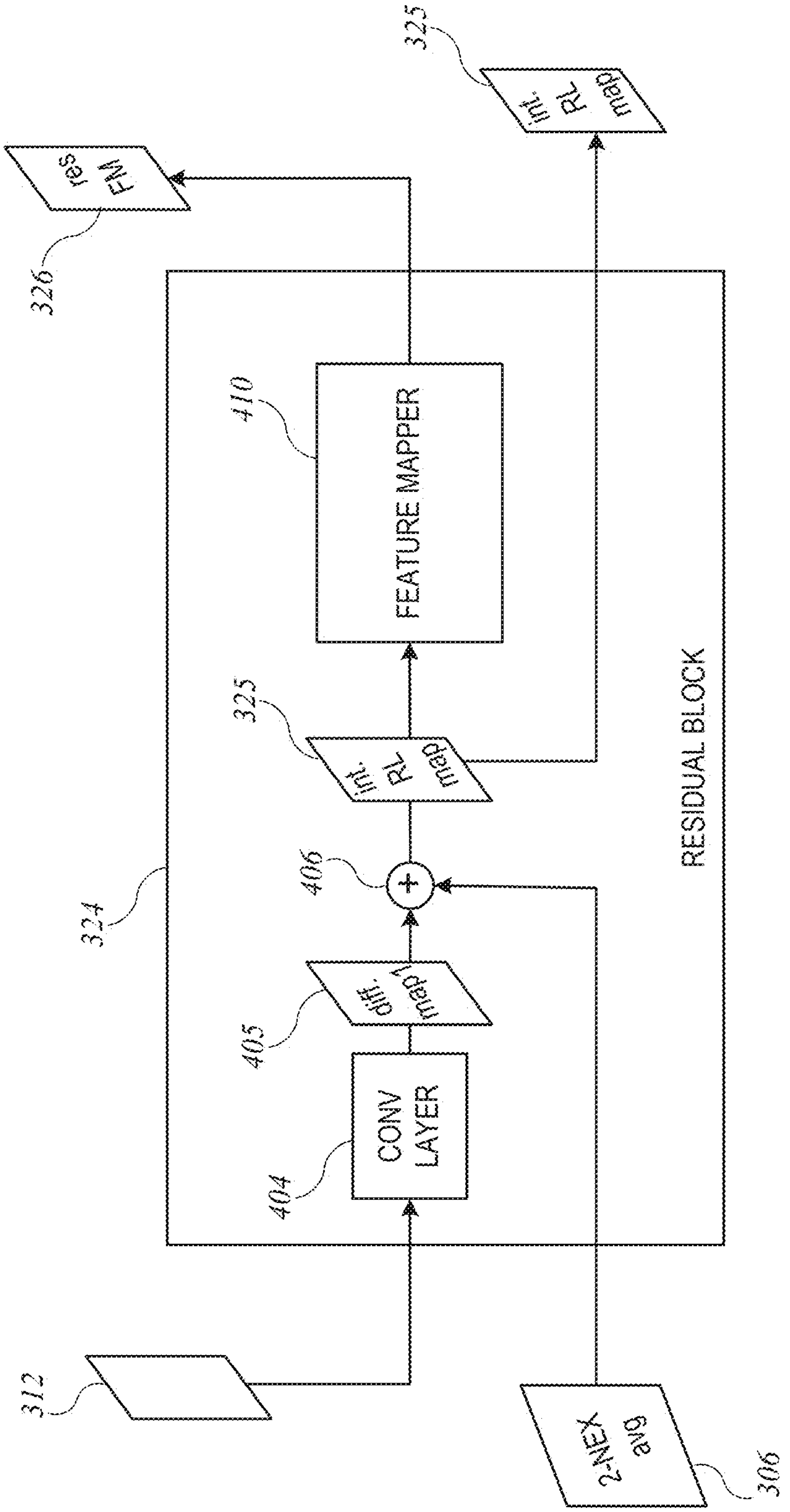
FIG. 4 shows a more detailed view of a residual block for a denoising neural network according to some embodiments.

Residual block 324 can perform additional operations to produce an intermediate residual-learning (RL) output map 325 and a residual filter feature map 326. FIG. 4 shows a more detailed workflow diagram of residual block 324 according to some embodiments. In this example, residual block 324 includes a convolutional layer 404 that produces a first (coarse) residual difference map 405. Map 405 is combined with the 2-NEX average image 306 via a skip connection built with sum 406 to produce intermediate residual-learning output map 325. Feature mapper 410 can apply a convolutional layer to intermediate residual-learning output map 325 to produce residual filter feature map 326. Both intermediate residual-learning output map 325 and residual filter feature map 326 can be provided to assembly module 330.

Figure 5:
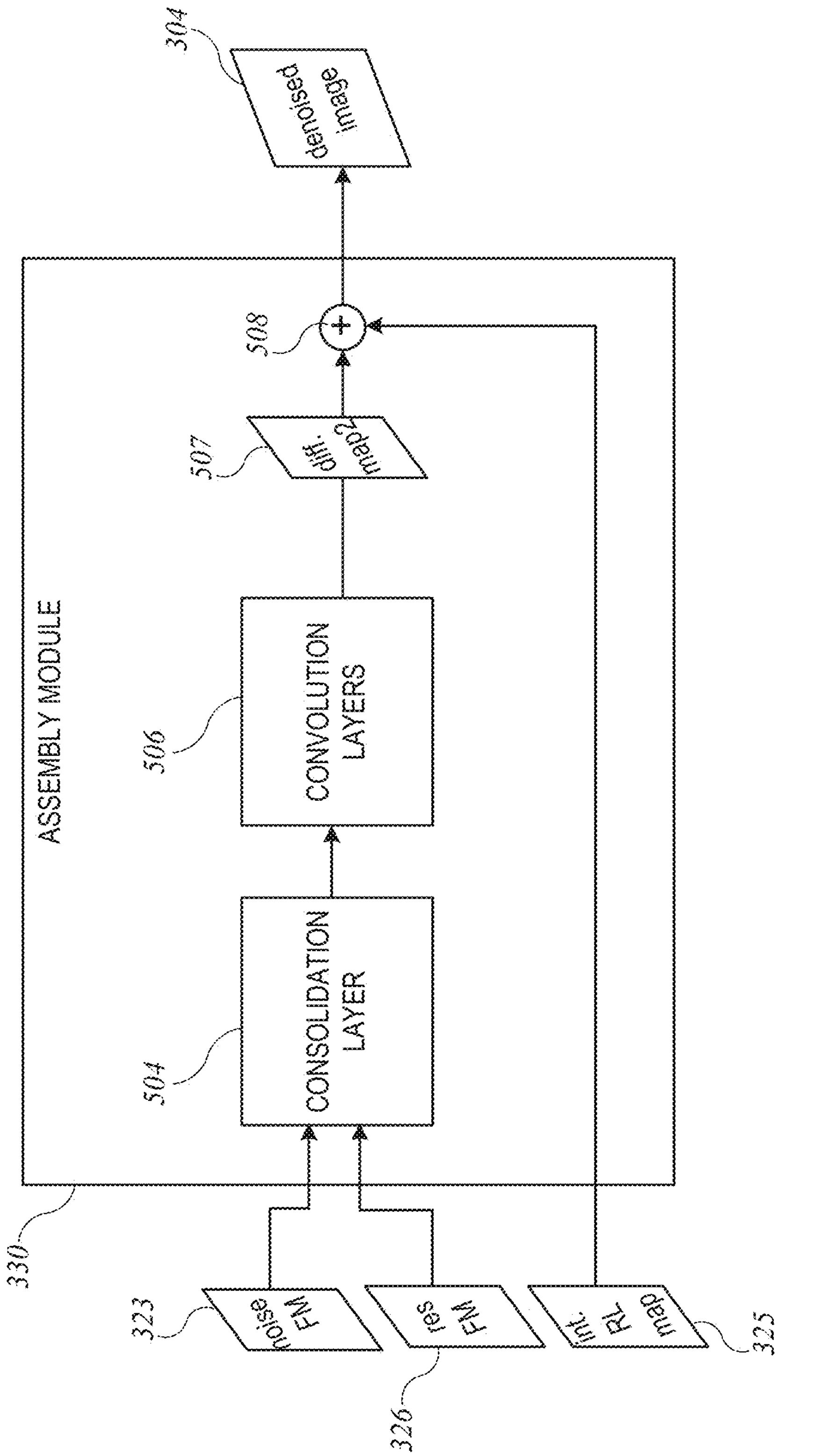
FIG. 5 shows a more detailed view of an assembly module for a denoising neural network according to some embodiments.

Assembly module 330 can produce a final denoised image using noise feature map 323, intermediate residual-learning output map 325, and residual filter feature map 326. FIG. 5 shows a more detailed workflow diagram of assembly module 330 according to some embodiments. In this example, assembly module 330 includes a consolidation layer 504, which can be a convolutional layer that consolidates a concatenation of noise feature map 323 and residual filter feature map 326, followed by one or more convolutional layers 506 that produce a second (refined) residual difference map 507. The second residual difference map 507 can be combined with the intermediate residual-learning output map 325 via a skip connection built with sum 508 to produce denoised output image 304.

In the embodiment shown in FIGS. 3-5, denoising system 300 provides the following features to support residual learning. First, denoising system 300 accepts a pair of 2-NEX images as input, which can facilitate determination of the inherent noise information. Using a pair of images as input creates a difference between the input format and the output format, in that the output has half as many pixels (or voxels) as the input. Consequently, a direct skip connection cannot be used for denoising. Instead, as described above, the average of the two images is applied for the skip connection in residual block 324. Second, residual learning proceeds in two stages. In the first stage, a first (coarse) residual difference map 405 is calculated and a skip connection is built on the 2-NEX average image 306, thereby producing intermediate residual-learning output map 325. In the second stage, features from both the 2-NEX input images and the intermediate residual-learning output map 325 are used to generate a second (refined) residual difference map 507. The final output 304 is obtained from the second residual difference map 507 with a skip connection to intermediate residual-learning output map 325. This structure allows the network to use both the strengthened signal and the inherent noise information from 2-NEX images.

A denoising neural network for denoising system 300 can be implemented using a variety of specific network parameters, depending in part on whether the analysis is operating on 2D or 3D images. An example implementation of system 300 for 2D input images can have a denoising neural network with the following configuration: Feature extraction module 330 can include six 128-kernel convolutional layers using a rectified linear unit (ReLU) activation function; the second through sixth layers can incorporate batch normalization (BN). Transporting block 332 can include one 64-kernel convolutional layer with ReLU and BN. In residual block 324, convolutional layer 404 can be a 64-kernel convolutional layer, and feature mapper 410 can be a convolutional layer with ReLU. In assembly module 330, consolidation layer 504 can include a first convolutional layer using a 128-kernel with ReLU and BN, and convolutional layers 506 can include five convolutional layers with the first through fourth layers incorporating ReLU and BN. In some implementations, the network has 14 layers and approximately 1.6 million trainable parameters. An example implementation of system 300 for 3D input images can be similarly structured, having the same number of layers in each module and block, with each 2D convolutional layer replaced by a 3D convolutional layer. To reduce computational resources, the filter number can be halved.

As noted above, system 300 can accept multi-channel inputs. For instance, the real and imaginary parts of two complex-valued input images can provide four channels. Multi-channel kernels can be employed to convolve with the multi-channel feature maps. In some embodiments, filtered outputs of multi-channel kernels can be summed over the channels to produce a new feature map. This process, sometimes referred to as cross-correlation, corresponds to channel-wise summation of the convolution outputs, where each channel is convolved with an independent kernel. If the kernels employ the same weights along channels, the cross-correlation is the same as directly filtering a channel-wise summed input with a kernel having these weights. In a more flexible approach used in some embodiments, the kernels can be independently updated toward a canonical expression of the fused feature map, potentially with different focuses. Where this more flexible approach is implemented, a multi-channel input can allow a more representative feature map than single-channel inputs in which the channels are summed.

By way of example, consider a 2-NEX acquisition that produces input images $X_1$ and $X_2$. The first convolutional layer in a two-channel 3D implementation of feature extraction module 310 can derive a feature map according to:

$$s(i,j,k) = ((X_1+X_2)*W)(i,j,k)+b = (X_1*W)(i,j,k)+(X_2*W)(i,j,k)+b = \sum_{n=1}^{2}(X_1^n*W_n)(i,j,k)+\sum_{n=1}^{2}(X_2^n*W_n)(i,j,k)+b \quad (2)$$

where n represents the real or imaginary channel of each complex-valued input image, $W_n$ denotes the corresponding sub-kernel of the convolutional kernel W, and b denotes the bias. In similar notation, the cross-correlation for the first four-channel convolutional layer can be denoted as:

$$s'(i,j,k) = (X_1*W^1)(i,j,k)+(X_2*W^2)(i,j,k)+b' = \sum_{n=1}^{2}\left[X_1^n*W_n^1(i,j,k)+X_2^n*W_n^2(i,j,k)+b'\right] \quad (3)$$

where $$W_n^m$$

represents the sub-kernel weights for the nth (real or imaginary) channel of the mth input image. The first layer may contain other operations, such as the nonlinear ReLU activation function; however, the present focus is on the convolution operation itself, which plays a major role in feature extraction.

Comparing Eqs. (2) and (3), it can be seen that s is only equal to s' when $W^1=W^2=W$ (the channel index n is omitted). Where $W^1$ and $W^2$ update separately, this condition is unlikely to be satisfied. As a result, s' of Eq. (3) provides a more flexible expression than s of Eq. (2). After backpropagation, the output of the first layer of the four-channel model theoretically cannot be worse than the corresponding output of the two-channel model. Thus, multi-image input (which increases the number of input channels) can increase the feature expression of the network.

In some embodiments, the number of model parameters increases with the number of input channels, as well as the model complexity (number of layers, kernel size, etc.). To avoid extreme cases where learning is not possible, each channel should possess extractable features. This is generally the case for real and imaginary parts of an MR image.

It should also be understood that, while Eqs. (2) and (3) illustrate the input-kernel interaction in the first convolutional layer of the network, other convolutional layers also convolve a multi-channel feature map with multi-channel kernels, and consequently, the cross-correlation exists in each convolutional layer. Accordingly, the input can be regarded as an initial feature map, which tends to be disjoint to cover as many useful features as possible. Inter-channel correlations, in which the channels are independent but serve together as a comprehensive image description, contribute to the performance of the model. Multi-NEX images provide suitable correlations for denoising tasks. For instance, each image can independently provide intact information about noise, while images jointly serve to represent the signal.

In some embodiments, the input images have isotropic spatial resolution, which can facilitate 3D reconstruction. As noted, 3D MR images have inherent redundancy, both in-plane and through-plane, which makes denoising possible. Using an implementation of denoising system 300 with a 2D CNN enables learning of 2D features, which are usable for denoising, while an implementation with a 3D CNN also enables learning of 3D features and can provide further performance improvements, with a tradeoff being higher computational costs due to the increased size of the network.

Training of Denoising System

Training of a deep neural network involves optimizing the weights for each node. A standard approach is to iteratively adjust the weights with the goal of minimizing a loss function that characterizes a difference between the output of the network for a given input and an expected result determined from a source other than the network. In "supervised" learning, the expected result, referred to as "ground truth," can be established by human annotation or by providing desired-outcome data obtained along with each item of training data. For example, to train a denoising network such as system 300, low-noise counterparts of the training images an be obtained. Training generally occurs across multiple "epochs," where each epoch consists of one pass through the training data set. Adjustment to weights can occur multiple times during an epoch; for instance, the training data can be divided into "batches" or "mini-batches" and weight adjustment can occur after each batch or mini-batch. Aspects of training of neural networks that are relevant to understanding the present disclosure are described herein; any other aspects can be modified as desired.

In some embodiments, denoising system 300 can be trained using a training data set that includes real images obtained using the acquisition protocol (e.g., 2-NEX) and a particular MRI system. To support supervised learning, a ground truth image corresponding to each set of training images can be obtained, e.g., using higher-NEX acquisition (e.g., 8-NEX), which provides a higher SNR.

A loss function for training denoising system 300 can be defined based on differences between the ground truth images and the output of denoising system 300. In some embodiments, the loss function can incorporate a combination of a mean-squared error loss term (also referred to as $l_2$ loss) and a structural similarity index measure (SSIM) loss term that accounts for the fact that the human visual system is sensitive to changes in local structure.

More specifically, it is noted that the mean-squared error ($l_2$) is probably the most widespread and convenient error measure used in loss functions for image-processing applications. However, $l_2$ does not correlate well with human perception of image quality. An alternative measure, SSIM, which is known in the art, evaluates image error while accounting for the fact that the human visual system is sensitive to changes in local structure. (SSIM is defined in Wang et al., "Image quality assessment: from error visibility to structural similarity," *IEEE Transactions on Image Processing* 13(4): 600-612 (2004).) In some embodiments, the loss function can incorporate a combination of $l_2$ loss and SSIM loss. For example the loss function L can be defined as $$\mathcal{L} = \operatorname{argmin}_f \|f(I_{2NEX}) - I_{8NEX}\|_2^2 * (1 - SSIM(f(I_{2NEX}), I_{8NEX})). \quad (4)$$

where f(·) denotes output of the neural network for a pair of input images ($I_2$NEX) and $I_{8NEX}$ represents ground truth. For 3D images, a 3D version of the SSIM loss can be substituted in Eq. (4).

It should be understood that with supervised learning, best results can be obtained by using training images obtained with the same MR acquisition protocol that will be used in inference mode. Retraining may be appropriate if there are changes in the protocol or other characteristics affecting noise. Further, factors such as water content in the tissues being imaged may affect noise distributions, and using a variety of different training images from diverse subjects may be desirable. It should also be understood that other techniques for providing ground truth images can be used. For instance, while lower noise in the ground truth images during training is expected to correlate with better performance in testing, images acquired with fewer than 8-NEX may be sufficient.

Further, it should be understood that embodiments are not limited to supervised learning. Other techniques, such as semi-supervised learning, unsupervised learning, or transfer learning can be employed.

The training approach described herein involves no prior assumptions about the spatial distribution of the noise variance or other properties of the noise. Reliance on real images for training of a denoising system can provide improvements over approaches that use neural networks trained on synthetic data, which is generated according to a model of noise that (as described above) may not accurately reflect the behavior of a real MRI system. By using real MR images to train a denoising system, the ability to denoise images can be improved as compared to neural networks trained on synthetic data.

Inference Mode

Once trained, denoising system 300 can be employed in inference mode (also sometimes referred to as "testing" mode) to generate denoised images, e.g., in clinical applications. For instance, a 2-NEX image acquisition can be performed to produce a set of images of a region of interest. The scan-time penalty relative to a 1-NEX acquisition protocol can be reduced e.g., by employing a rapid low-SNR 2-NEX acquisition with protocol optimizations. The two complex images can be input to denoising system 300, which can output a denoised image.

Example Implementations: 2D Image Denoising

To illustrate the performance of a denoising system for 2D images implemented using techniques described herein, images of knee joints of volunteers were taken. Data sets were acquired using a Philips Achieva TX 3.0T MRI instrument (Philips Healthcare, Best, Netherlands) with an eight-channel receiver knee coil (manufactured by Invivo of Gainesville, FL, USA). A 3D proton density-weighted FSE/TSE VISTA™ pulse sequence was used, with the following MRI parameters: repetition time/echo time of 900/33.6 ms; 150 slices with an isotropic resolution of 0.8×0.8×0.8 mm; an echo train length of 42; and a SENSE acceleration factor of 2. The imaging acquisition time per NEX was approximately 2.9 min. Both 2-NEX and 8-NEX acquisitions were performed. Datasets including 8-NEX 3D FSE MRI data were collected from 67 healthy volunteers; 50 of these datasets were used for training and 17 were used for testing. In addition, 40 3D FSE MRI datasets with 2-NEX were collected from 40 patients (categorized into the four Kellegren and Lawrence (KL) grades for the classification of osteoarthritis, with KL4 being the most severe) exhibiting various stages of osteoarthritis, and these datasets were used for testing.

An implementation of denoising system 300 for 2D images was configured with 14 layers as described above. Each convolutional layer had a filter size of 3×3, stride 1, and padding 1. BN and ReLU activation function were incorporated as described above. For training, the loss function was defined according to Eq. (4) above. Adam optimizer and the ReduceLROnPlateau monitor were applied, with an initial learning rate of 0.0001, which was decayed by a factor of 0.2 when loss stopped decreasing for 10 epochs. Complete 214×214 images were used as inputs, with batch size of 8. This illustrative embodiment is referred to below as "2D-multiCH" (for 2D multi-channel model). Other implementations are also possible.

Training was performed separately for three different imaging planes (axial, coronal, and sagittal), and testing was performed on different 2D image slices in each plane.

In addition, denoising system 300 was implemented in each of a "dual-input" configuration, in which the input was a concatenation of a pair of complex-valued 2-NEX images (total of four channels), and a "single-input" configuration, in which the input was the average of a pair of complex-valued 2-NEX images (total of two channels). It is noted that information about the noise distribution is latently present in the dual-input configuration (in that the difference of the images approximates the noise distribution) but not in the single-input configuration.

Figure 6:
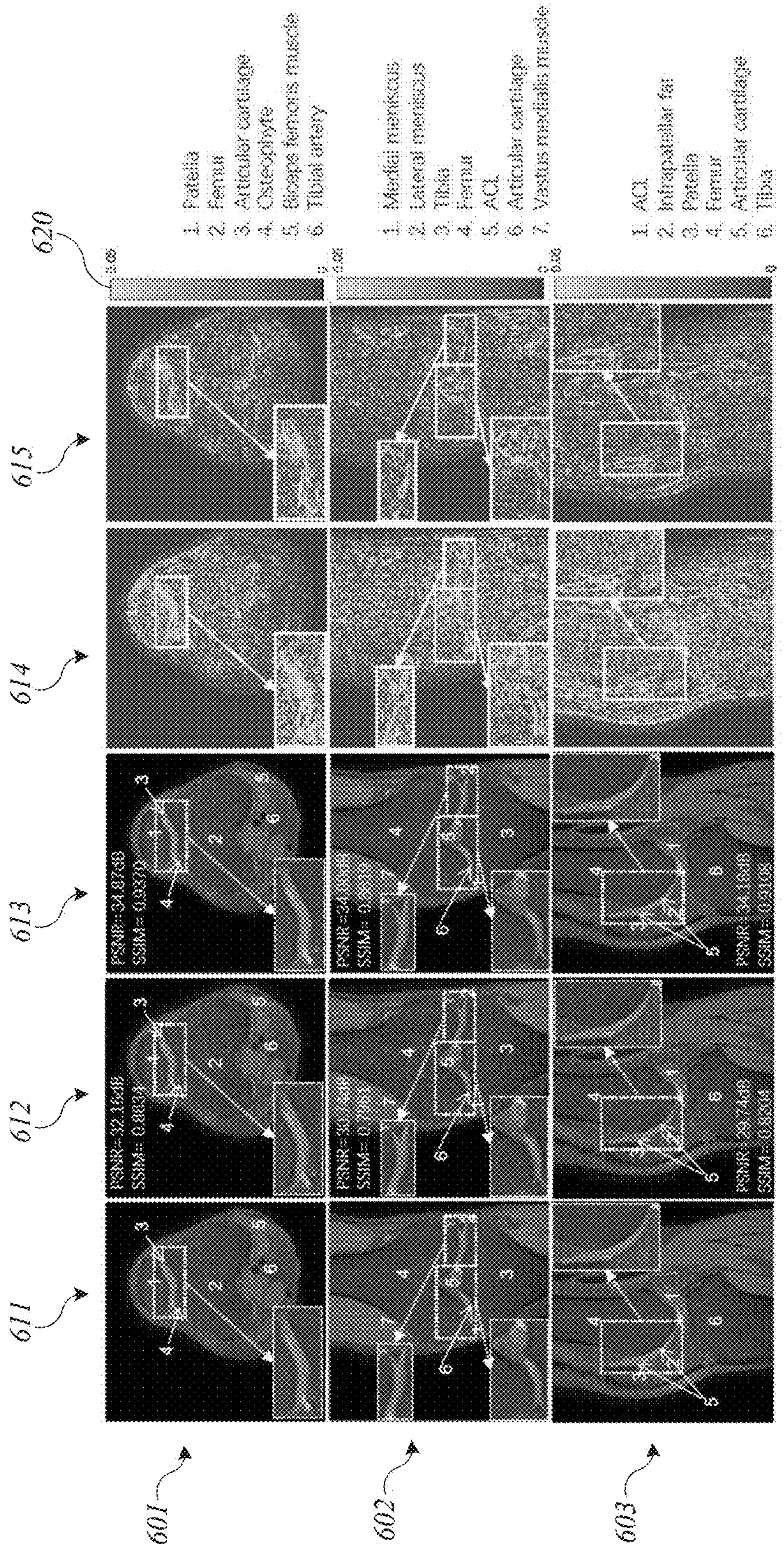
FIG. 6 shows examples of images obtained for three different planar cross sections of a knee joint, comparing images obtained using an averaging technique and images obtained according to an embodiment.

FIG. 6 shows examples of images obtained for three different planar cross sections of a knee joint: axial plane in row 601, coronal plane in row 602, sagittal plane in row 603. Each image includes inset enlargements of selected regions, as indicated by the boxes and arrows, and is annotated with numbers identifying anatomical structures according to the legend at the right end of each row. Shown in column 611 are ground truth (8-NEX) images. Shown in column 612 are "conventional" denoised images obtained by averaging the 2-NEX images. Shown in column 613 are denoised images output from the 2D-multiCH implementation applied to the 2-NEX images. Shown in column 614 are residual noise images for the conventional approach, as determined by subtracting the ground truth image in column 611 from the averaged image in column 612. The residual noise is color-coded according to the scale at 620. Shown in column 615 are residual noise images, as determined by subtracting the ground truth image in column 611 from the output of the 2D-multiCH implementation in column 613. (As with column 614, the residual noise is color-coded according to the scale at 620.) As can be seen by comparing the images in columns 614 and 615, the output images of denoising system 300 include significantly less residual noise than the conventional (averaged) images. It should be understood that FIG. 6 is illustrative of results that can be attained.

Quantitative comparisons were made using the metrics of peak signal-to-noise ratio (PSNR) and the SSIM value. These quantities were defined as follows: Given a reference image f and a test image g, with mean luminance $\mu_f$ and $\mu_g$, respectively, standard deviation $\sigma_f$ and $\sigma_g$, respectively, and covariance $\sigma_{fg}$ between f and g, the PSNR and SSIM between f and g are defined as:

$$PSNR(f, g) = 10\log_{10}\left(\frac{255^2}{MSE(f, g)}\right), \tag{5}$$

where MSE (f, g) is the mean square error between f and g, and $$SSIM(f, g) = \frac{(2\mu_f\mu_g + C_1)(2\sigma_{fg} + C_2)}{(\mu_{f2} + \mu_g^2 + C_1)(\sigma_f^2 + \sigma_g^2 + C_2)}, \quad (6)$$

where $C_1$ and $C_2$ are constants used to avoid division by zero. A higher PSNR indicates a higher image quality, and the closer that the SSIM value for two images is to 1, the more similar are the two structures. SSIM was locally calculated using an 11×11 Gaussian window, and the mean value of the local calculations was used as the final measure. Matlab R2021a (Mathworks, Natick, MA, USA) was used for image analysis.

FIG. 7 shows a table 700 comparing mean PSNR and SSIM denoising results for a conventional 2-NEX averaging technique and the dual-input 2D-multiCH implementation. The mean was obtained over images from the healthy volunteer testing data sets in the axial, coronal, and sagittal planes. It is noted that the noise level and distribution of 2-NEX average images differs in each plane, even for the same knee, due to spatially variant characteristics of noise. The 2D-multiCH model was trained using MR images containing real noise and was therefore able to achieve denoising performance in all three planes superior to conventional averaging methods.

Figure 8:
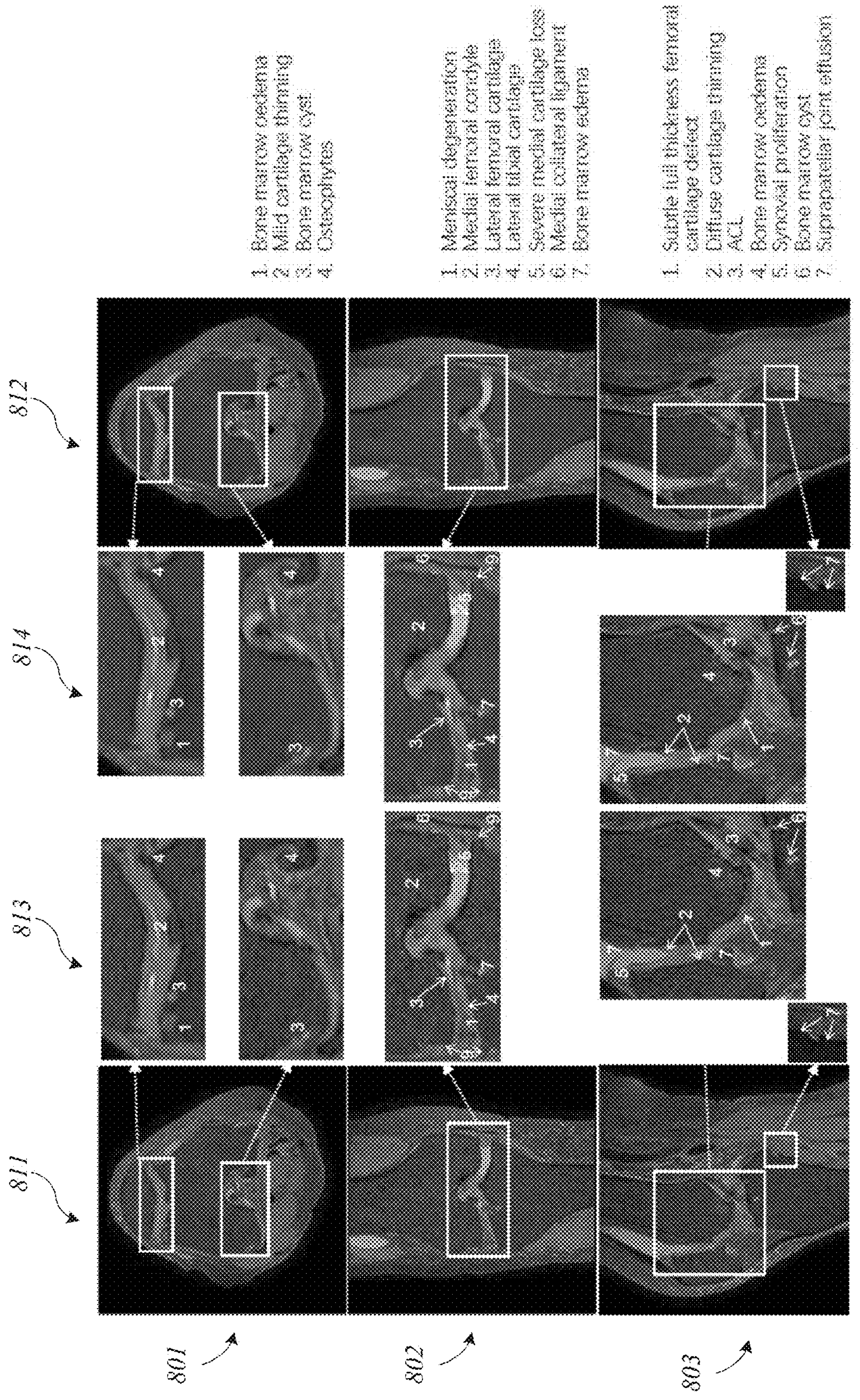
FIG. 8 shows a representative example of denoised images in a patient test dataset using a technique according to an embodiment.

As a further assessment of performance, the quality of denoised images from the patient datasets was independently reviewed for perceived SNR, overall image quality, and structure visibility by a radiologist with specialty fellowship training in musculoskeletal radiology. The specific anatomical structures of the knee that were evaluated were the cartilage, anterior cruciate ligament, posterior cruciate ligament, medial collateral ligament, lateral collateral ligament, medial meniscus, lateral meniscus, extensor tendons, and bone. By way of illustration, FIG. 8 shows a representative result of denoising of a patient test dataset using dual-input 2D-multiCH according to an embodiment. Row 801 shows an axial-plane image; row 802 shows a coronal-plane image; and row 803 shows a sagittal-plane image. Column 811 shows the average of 2-NEX input images; column 812 shows denoised images obtained using dual-input 2D-multiCH. Columns 813 and 814 show enlarged images of selected regions of the images in columns 811 and 812, respectively, highlighting fine structural information. In this example, the subject had KL4 osteoarthritis, and characteristic radiological findings, such as cartilage thinning, osteophytosis, bone marrow cysts, bone marrow edema, joint effusions, and para-labral cysts, were clearly identified by a radiologist in the denoised images, as indicated by the numeric annotations and the legend at the right of each row. As this example illustrates, the 2D-multiCH implementation provided improved denoising (relative to conventional averaging) in regions corresponding to anatomical structures of clinical interest, providing superior perceived signal-to-noise ratio and improved overall imaging quality.

Figure 9:
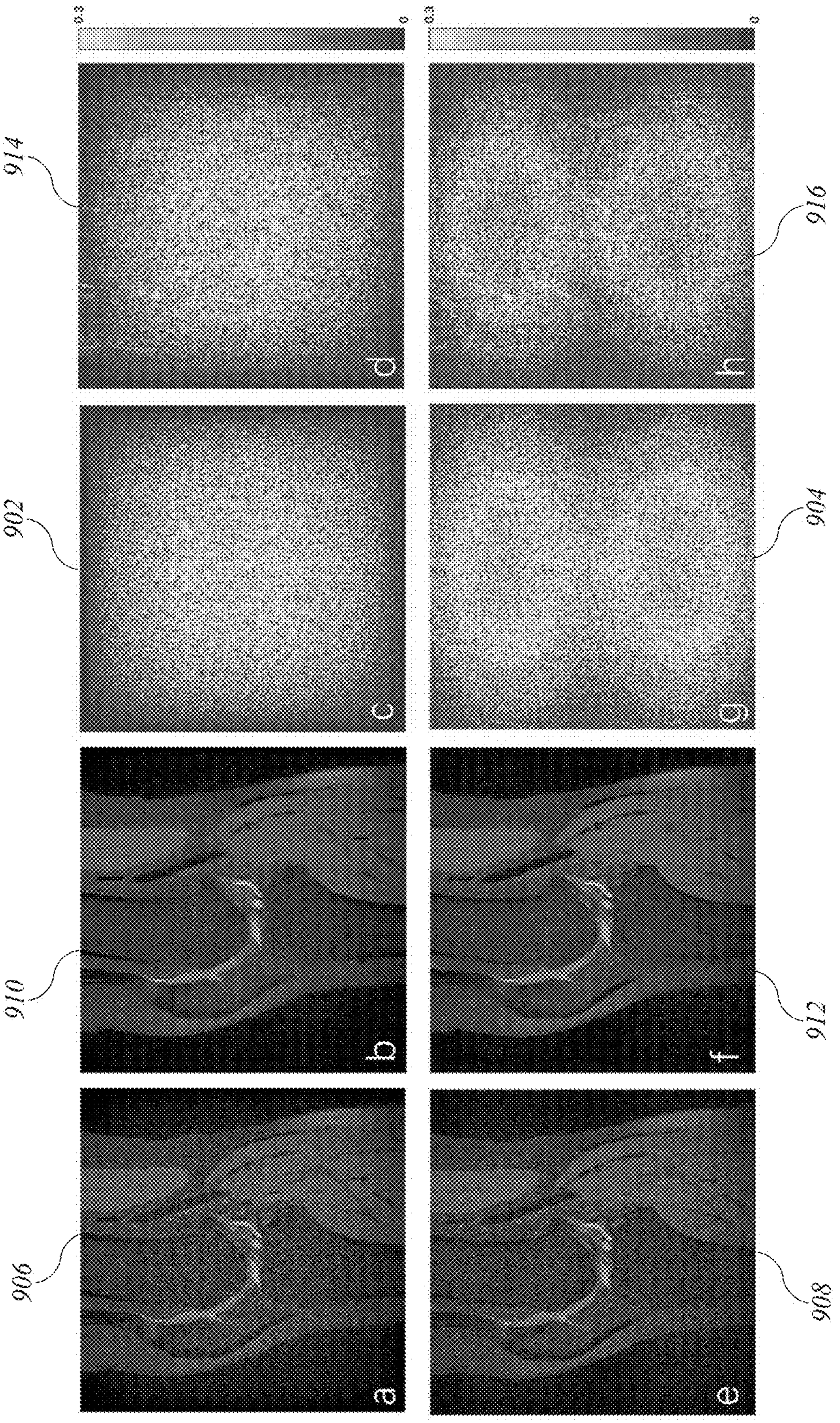
FIG. 9 shows an illustrative example of denoised images using a technique according to an embodiment applied to images with synthetic noise.

To further illustrate the ability of the 2D-multiCH implementation to learn non-stationary noise, MR images were synthesized using a known spatial noise distribution, and denoising was performed on the synthesized images. FIG. 9 shows an illustrative result of denoising with synthesized noise. Images 902 and 904 represent two different synthetic noise patterns. Images 906 and 908 represent synthesized MR images obtained by combining synthetic noise patterns 902 and 904, respectively, with a low-noise (8-NEX) MR image. Images 910 and 912 show the resulting denoised image obtained by providing images 906 and 908 as inputs to the 2D-mulitCH implementation. Images 914 and 916 represent a noise "prediction," calculated as the difference between denoised images 910, 912 and input images 906, 908. The predictions 914, 916 show a good match to the synthetic noise 902, 904.

Results obtained for the 2D-multiCH implementation were also compared to conventional denoising techniques. To provide a baseline for comparison, four conventional denoising techniques for 2D images were also implemented and trained on the same dataset. The conventional techniques used were: (1) BM3D (described in K. Dabov et al., "Image denoising by sparse 3-D transform-domain collaborative filtering," *IEEE Transactions on image processing,* 16(8): 2080-2095 (2007)); (2) DnCNN (described in K. Zhang et al., "Beyond a gaussian denoiser: Residual learning of deep cnn for image denoising," *IEEE transactions on image processing,* 26(7): 3142-3155 (2017)); (3) DL-ASL (described in D. Xie et al., "Denoising arterial spin labeling perfusion MRI with deep machine learning," *Magnetic resonance imaging,* 68:95-105 (2020)); and (4) RicianNet (described in S. Li et al., "MRI denoising using progressively distribution-based neural network," *Magnetic resonance imaging,* 71:55-68 (2020)). BM3D and DnCNN can only process single inputs, so dual inputs were not used with these two methods; for DL-ASL and RicianNet, both single-input and dual-input implementations were provided. As with the 2D-multiCH implementation, networks were trained separately for axial, coronal, and sagittal imaging planes.

Figure 10:
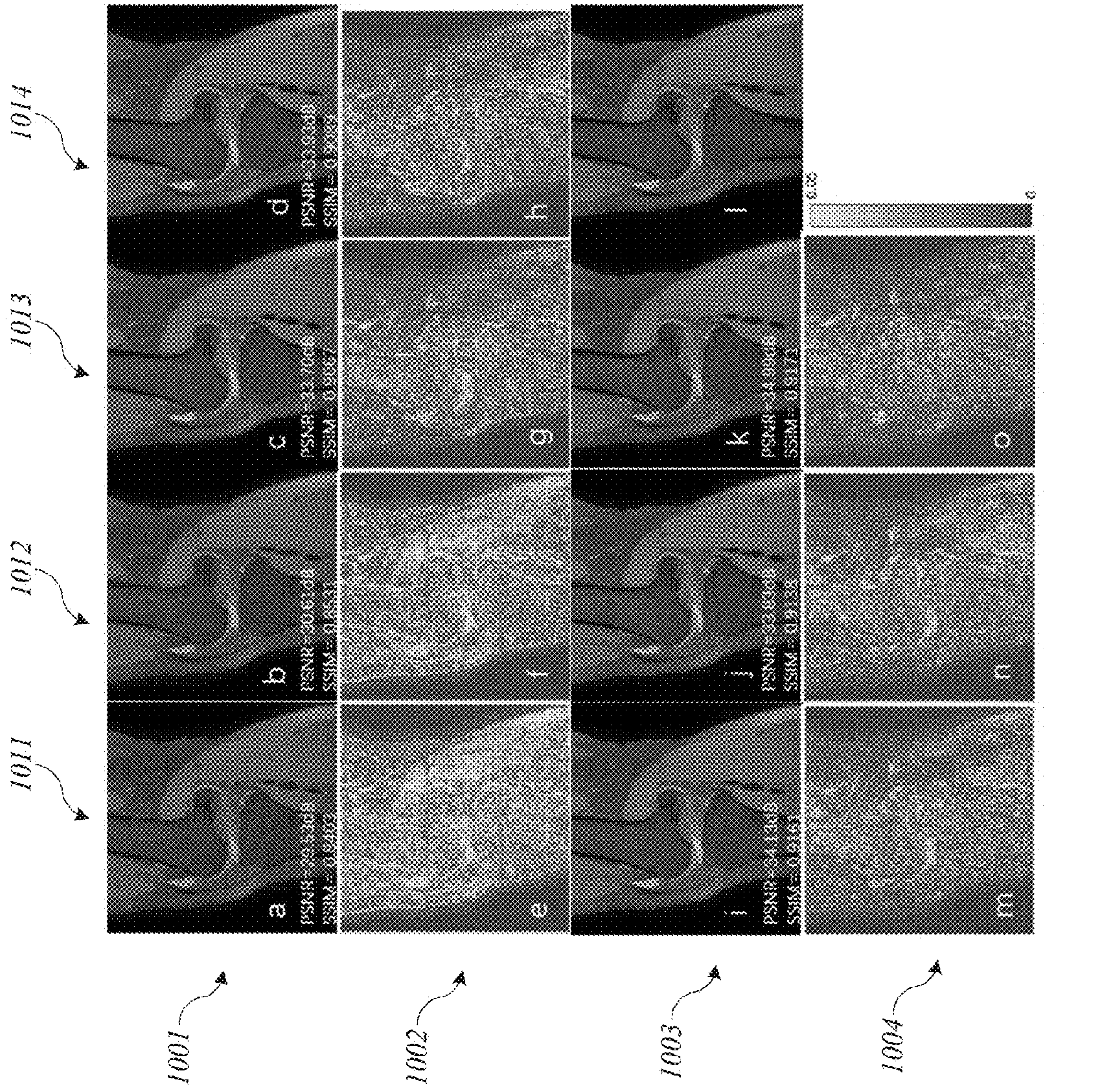
FIG. 10 shows representative examples of denoised image using various techniques including conventional techniques and a technique according to an embodiment.

FIG. 10 shows representative examples of denoising results for various techniques studied. At row 1001, column 1011, image (a) is an average of 2-NEX images. At row 1003, column 1014, image (l) is the corresponding ground truth 8-NEX image. In row 1001, image (b) at column 1012 was obtained using BM3D; image (c) at column 1013 was obtained using DnCNN; and image (d) at column 1014 was obtained using a single-input implementation of 2D-multiCH according to an embodiment. Row 1002 includes images (e), (f), (g), and (h), which are residual noise maps obtained by comparing images (a)-(d) of row 1001, respectively to the ground-truth image (l). As can be seen, the single-input implementation of 2D-multiCH reduces residual noise compared to other single-input methods. In row 1003, images from dual-input implementations are shown. Image (i) at column 1011 was obtained using DL-ASL; image (j) at column 1012 was obtained using RicianNet; and image (k) at column 1013 was obtained using a dual-input implementation of 2D-multiCH according to an embodiment. Row 1004 includes images (m), (n), and (o), which are residual noise maps obtained by comparing images (i)-(k) of row 1003, respectively to the ground-truth image (l). As can be seen, the dual-input implementation of 2D-multiCH reduces residual noise compared to conventional dual-input techniques and also outperforms the single-input implementation of 2D-multiCH.

As a more quantitative comparison, FIG. 11 shows a table 1100 of average PSNR and SSIM results obtained for sagittal plane testing of healthy volunteer datasets using 2D-multiCH according to some embodiments and using conventional techniques. Table 1100 shows that deep-learning models generally provide superior performance compared to the (non-learning-based) BM3D technique. Table 1100 also shows 2D-multiCH performing better than the conventional models in both metrics, particularly in the dual-input implementation, which takes advantage of the noise information in the pair of 2-NEX images.

In addition, ablation studies were performed to compare alternative embodiments of bridge module 320. In one study, transporting block 322 was omitted, and in another study, residual block 324 was omitted. FIG. 12 shows a table 1200 summarizing results of the ablation studies. The top row is the 2D-multiCH implementation with both transporting block 322 and residual block 324. "Model-Tra" denotes an alternative embodiment with only transporting block 322 (omitting residual block 324), and "Model-Res" denotes an alternative embodiment with only residual block 324 (omitting transporting block 322). The PSNR and SSIM values are averages over the healthy volunteer test datasets. Table 1200 indicates that including both blocks improves performance relative to including only one or the other. Analysis of the alternative embodiments suggests that transporting block 322 effectively preserves overall noise information from the 2-NEX input images, while residual block 324 extracts more subtle noise information from the (already coarsely denoised) intermediate residual output. Accordingly, a bridge module structured as shown in FIGS. 3 and 4 can provide enhanced performance compared to other CNN-based denoising methods.

Example Implementations: 3D Image Denoising

To illustrate the performance of a denoising system for 3D images implemented using techniques described herein, 3D MR images of knee joints of volunteers were acquired. Data sets were acquired using a Philips Achieva TX 3.0T MRI instrument (Philips Healthcare, Best, Netherlands) with an eight-channel receiver knee coil (manufactured by Invivo of Gainesville, FL, USA). A 3D proton density-weighted FSE/TSE VISTA™ pulse sequence was used, with the following MRI parameters: repetition time/echo time of 900/33.6 ms; an echo train length of 42; and a SENSE acceleration factor of 2. Both 2-NEX and 8-NEX acquisitions were performed. Datasets including 8-NEX 3D FSE MRI data were collected from 68 healthy volunteers. Of these, 7200 patches from 50 of these datasets were used for training, and the other 18 were used for testing. All voxels were interpolated to a common resolution of 0.714 $m^3$. To cover more 3D information, a cubic voxel of dimension 64×64×64 with a sliding stride of 32×32×32 was used for input. Outputs with the same shape were generated in the interest of computational efficiency, instead of only outputting the central slice.

Figure 13B:
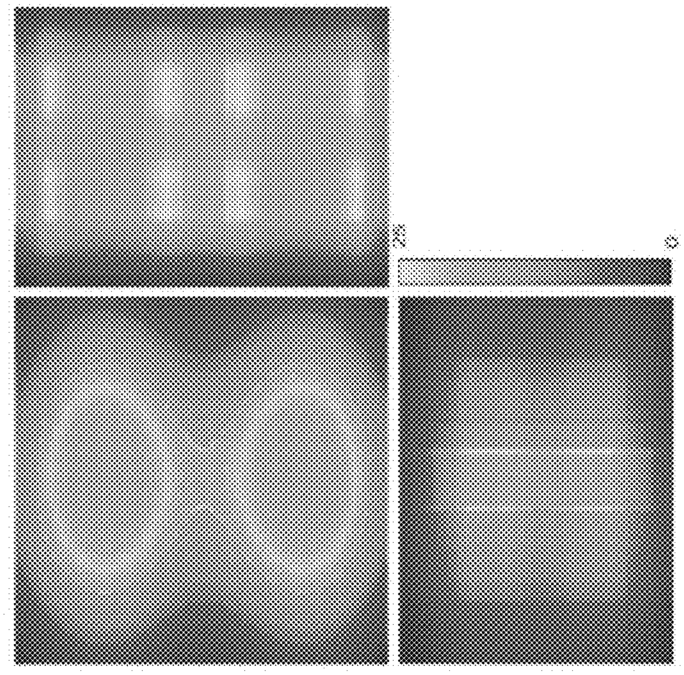
FIGS. 13A and 13B show axial, coronal, and sagittal views of 3D synthetic noise patterns used to test 3D denoising systems.
Figure 13A:
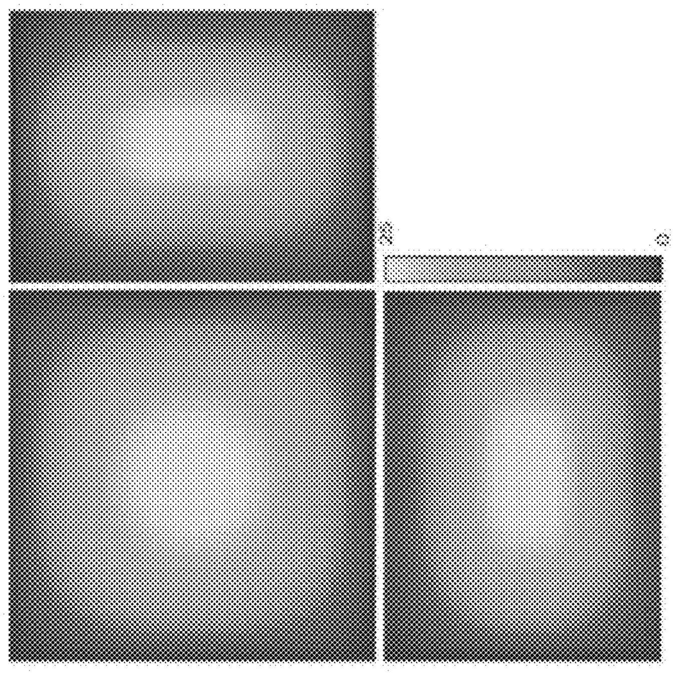

In addition, studies were made using synthetic noise. Two types of spatially-variant noise were employed to generate 3D non-stationary noisy datasets. FIGS. 13A and 13B show axial, coronal, and sagittal views of the 3D noise variance patterns. "Pattern 1," shown in FIG. 13A, has highest noise variance in the central region, decreasing in different directions. "Pattern 2," shown in FIG. 13B, provides a more complicated spatial distribution. Noisy datasets were generated by random sampling within the range of noise values for each voxel.

An implementation of denoising system 300 for 3D images was configured as described above. Each convolutional layer had a filter size of 3×3×3, stride 1, and padding 1. BN and ReLU activation function were incorporated as described above. For training, the loss function was defined according to Eq. (4) above, with 3DSSIM replacing 2D SSIM. The Adam optimizer and the ReduceLROnPlateau monitor were applied, with an initial learning rate of 0.0001, which was decayed by a factor of 0.2 when loss stopped decreasing for 10 epochs. The inputs consisted of 7200 patches, with batch size of 8. This illustrative embodiment is referred to below as "3D-multiCH" (for 3D multi-channel model). Other implementations are also possible.

Results obtained for the 3D-multiCH implementation were also compared to conventional methods. To provide a baseline for comparison, three conventional denoising techniques for 3D images were also implemented and trained on the same dataset. The conventional techniques used were: (1) BM4D (described in M. Maggioni et al., "Nonlocal transform-domain filter for volumetric data denoising and reconstruction," *IEEE transactions on image processing,* 22(1), 119-133 (2012)); (2) a 3D extension of DnCNN with eight layers (described in K. Zhang et al., "Beyond a gaussian denoiser: Residual learning of deep cnn for image denoising," *IEEE transactions on image processing,* 26(7), 3142-3155 (2017)); and (3) 3D-Parallel-RicianNet (described in L. Wu et al., "Denoising of 3D Brain MR Images with Parallel Residual Learning of Convolutional Neural Network Using Global and Local Feature Extraction," in *Computational Intelligence and Neuroscience,* 2021 (2021)). BM4D supports optional blind-denoising of Rician noise with a hard threshold and a Wiener filtering, and both "Non-Blind" and "Blind" versions of BM4D were implemented. Since the conventional denoising techniques for 3D images can only process equal input and output formats, a single-input implementation of 3D-multiCH was also trained using the (complex-valued) average of the 2-NEX input images as input; this illustrative embodiment is referred to as "3D-multiCH-avgIn." The same average images were used as inputs for the conventional denoising techniques. To compare 2D and 3D denoising performance, results were also compared to the 2D-multiCH implementation described above and to the conventional 2D DnCNN technique.

Figure 14A:
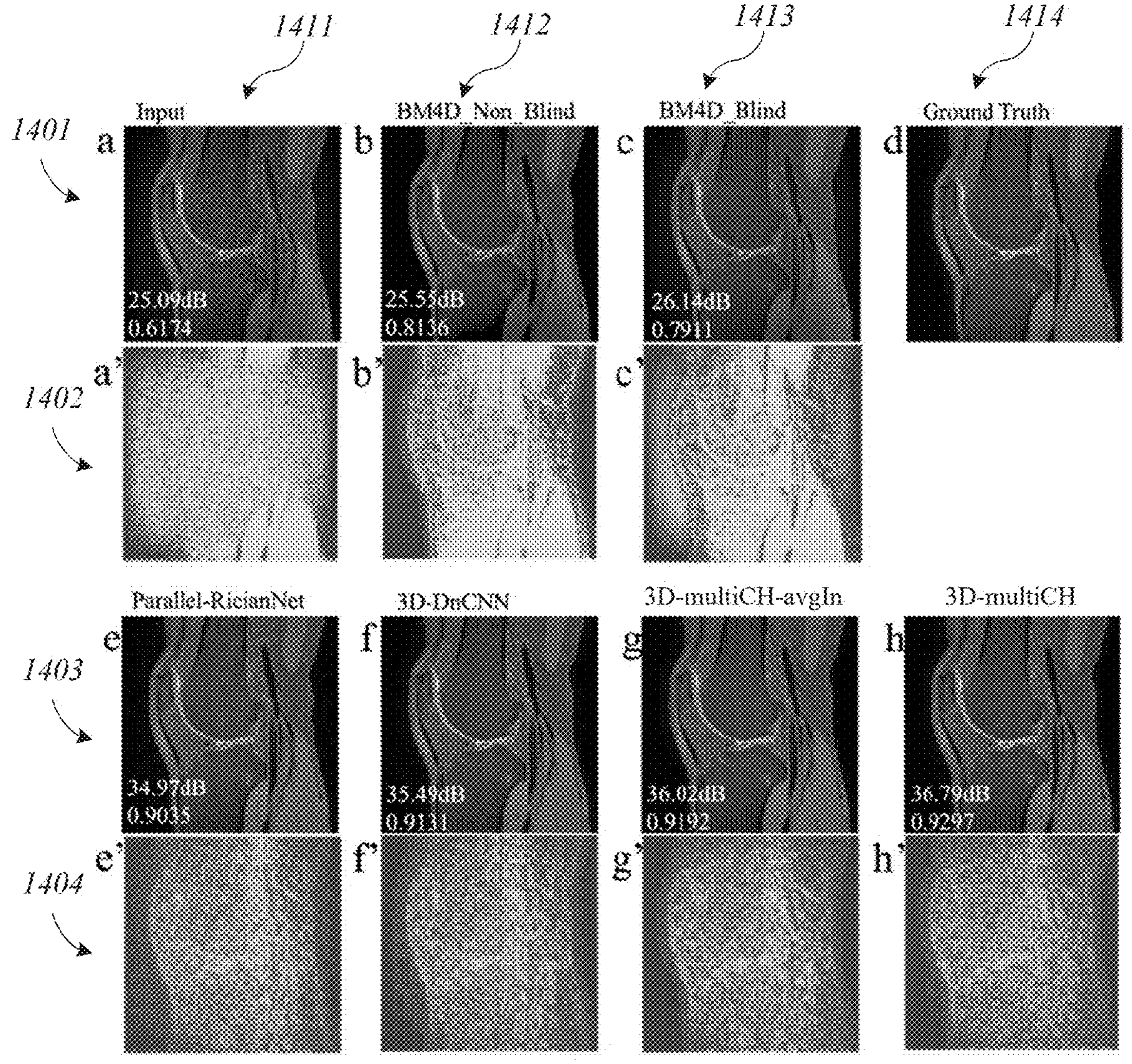
FIGS. 14A and 14B show representative examples of denoised images obtained using various techniques including conventional techniques and techniques according to various embodiments.
Figure 14B:
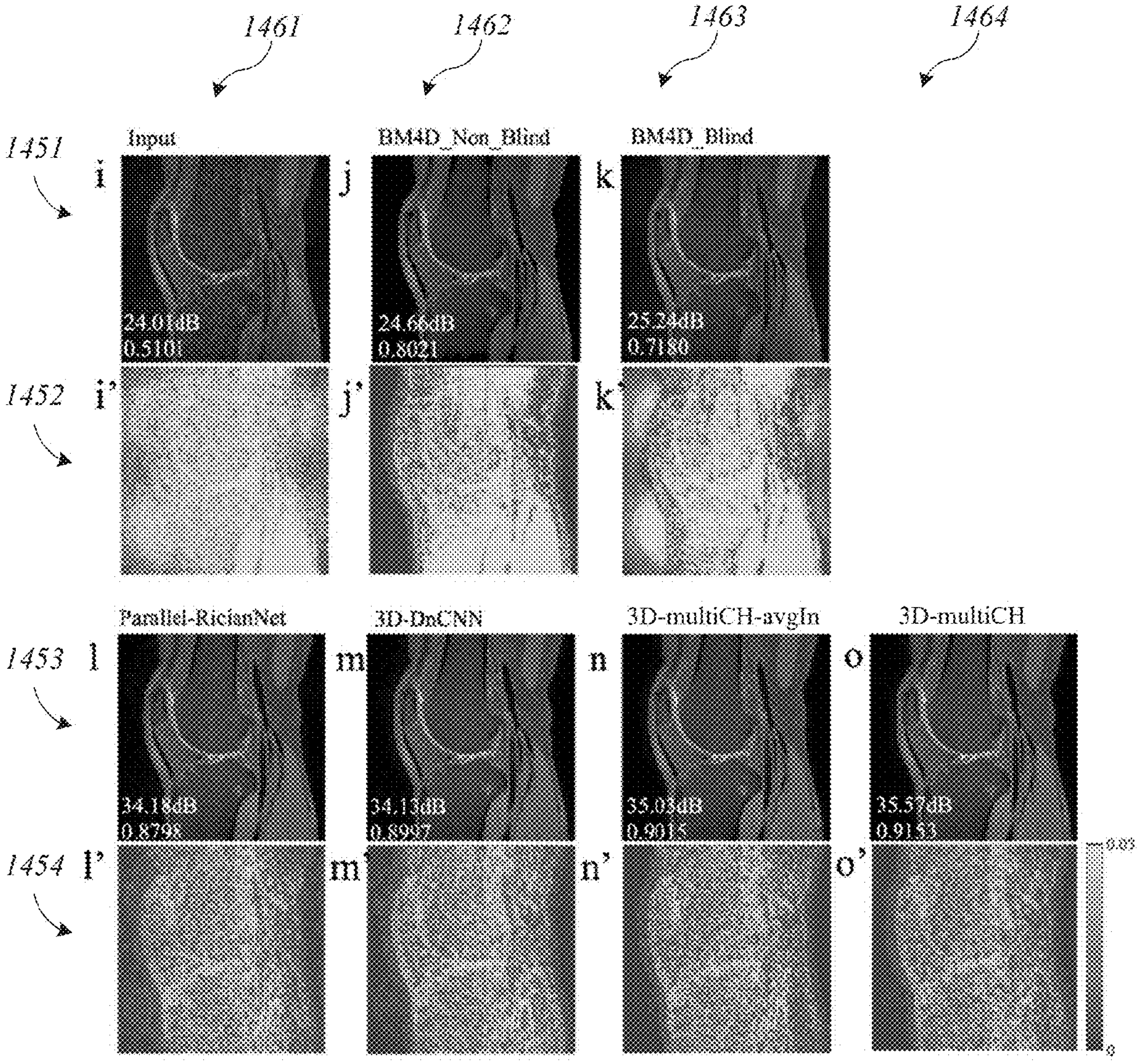

FIGS. 14A and 14B show representative examples of denoising results for various methods studied. Referring first to FIG. 14A, at row 1401, column 1411, image (a) is a synthetic image obtained by applying the noise pattern of FIG. 13A to a ground-truth MR image; at row 1401, column 1414, image (d) is the ground truth. Other images in rows 1401 and 1403 were obtained by applying various denoising techniques to image (a). Specifically, in row 1401, image (b) at column 1412 was obtained using BM4D (non-blind); and image (c) at column 1413 was obtained using BM4D (blind). In row 1403, image (e) at column 1411 was obtained using Parallel-RicianNet; image (f) at column 1412 was obtained using 3D DnCNN; image (g) at column 1413 was obtained using 3D-multiCH-avgIn according to an embodiment; and image (h) at column 1414 was obtained using 3D-multiCH according to an embodiment. Row 1402 includes residual noise maps obtained by comparing the images in row 1401, columns 1411-1413 to ground truth image (d). Similarly, row 1404 includes residual noise maps obtained by comparing the images in row 1403, columns 1411-1414 to ground truth image (d). Turning to FIG. 14B, at row 1451, column 1461, image (i) is a synthetic image obtained by applying the noise pattern of FIG. 13B to the ground-truth MR image (d) shown at row 1401, column 1414 of FIG. 14A. Other images in rows 1451 and 1453 were obtained by applying various denoising techniques to image (i). Specifically, in row 1451, image (j) at column 1462 was obtained using BM4D (non-blind); and image (k) at column 1463 was obtained using BM4D (blind). In row 1453, image (1) at column 1461 was obtained using Parallel-RicianNet; image (m) at column 1462 was obtained using 3D DnCNN; image (n) at column 1463 was obtained using 3D-multiCH-avgIn according to an embodiment; and image (o) at column 1464 was obtained using 3D-multiCH according to an embodiment. Row 1452 includes residual noise maps obtained by comparing the images in row 1451, columns 1461-1463 to ground truth image (d) of FIG. 14A. Similarly, row 1454 includes residual noise maps obtained by comparing the images in row 1453, columns 1461-1464 to ground truth image (d) of FIG. 14A. As can be seen, the dual-input implementation of 3D-multiCH reduces residual noise compared to conventional dual-input denoising techniques and also outperforms the single-input implementation (3D-multiCH-avgIn).

Quantitative evaluation used 2D PSNR and 2D SSIM metrics as defined in Eqs. (5) and (6) above, as well as a 3D PSNR, also defined according to Eq. (5), and a 3D multi-scale structural similarity index (3DSSIM), defined as:

$$3DSSIM(f,g) = [l_m(f,g)]^{\alpha_M} \cdot \prod_{j=1}^{M} [c_j(f,g)]^{\beta_j} [s_j(f,g)]^{\gamma_j}. \tag{7}$$

where $l_m(f, g)$, $c_j(f, g)$, and $s_j(f, g)$ refer to the luminance, chrominance, and structure comparison measures, respectively, and $\alpha_M$, $\beta_j$, and $\gamma_j$ are parameters defining the relative importance of the three measures.

FIGS. 15 and 16 are tables 1500, 1600 showing performance metrics for various denoising methods applied to synthesized MR images incorporating the synthetic non-stationary noise patterns of FIGS. 13A (Pattern 1) and 13B (Pattern 2). Table 1500 shows 2D PSNR and 2D SSIM, and table 1600 shows 3D PSNR and 3D SSIM. Tables 1500 and 1600 indicate that all of the deep learning methods performed better than BM4D, and further indicate that both versions of 3D-multiCH achieved the best performance. In particular, 3D-multiCH (using dual input images) achieved the best overall performance, while 3D-multiCH-avgIn (using average of two images as the input) achieved second best.

Figure 17:
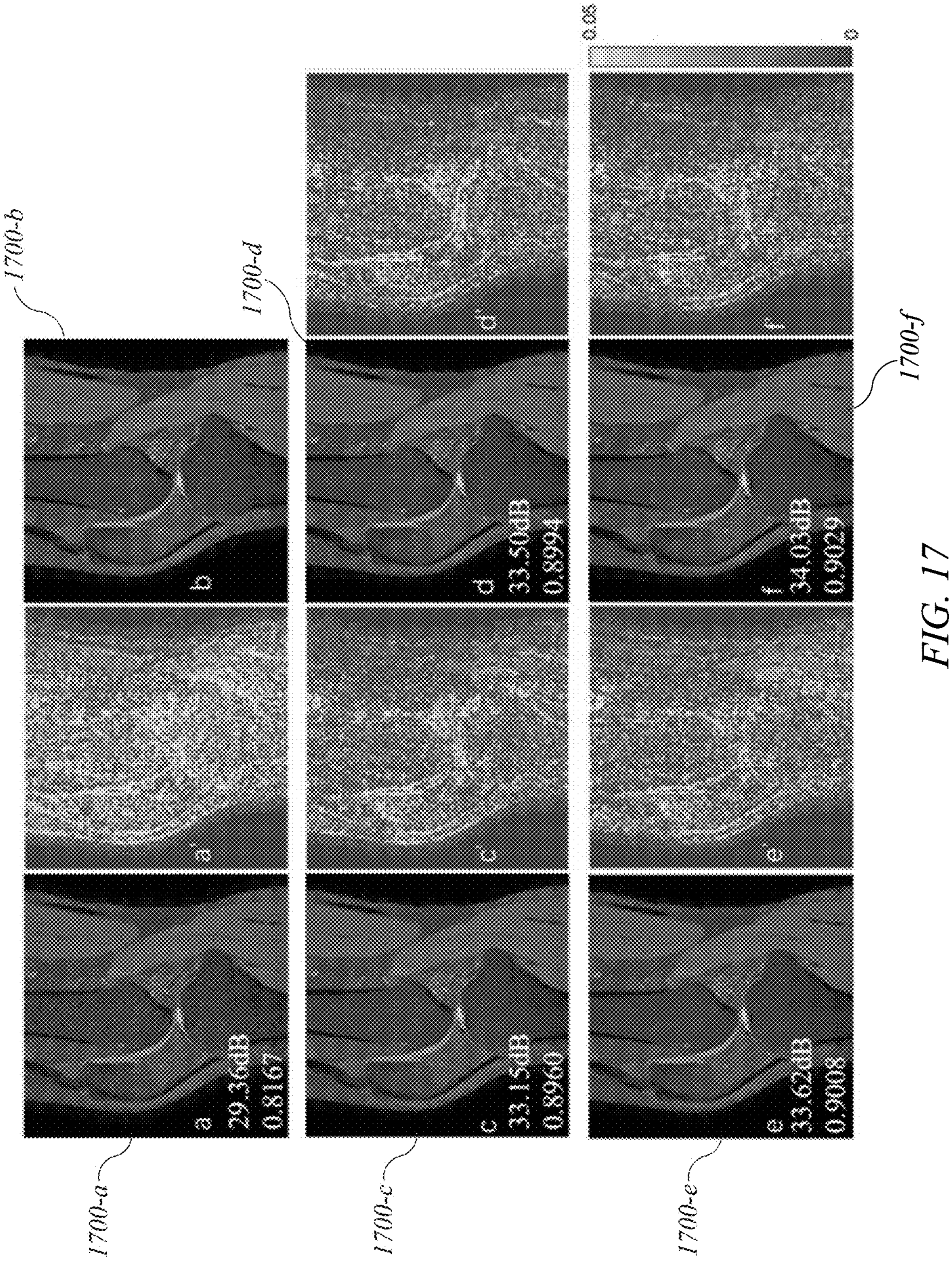
FIG. 17 shows representative examples of denoised images obtained using various techniques including conventional techniques and techniques according to various embodiments.

Performance on real MR images (without synthetic noise) was also compared among 2D DnCNN, 3D DnCNN, 2D-multiCH, and 3D-multiCH. FIG. 17 shows representative examples of denoising results for various methods studied. Image 1700-*a* is an average of 2-NEX images; image 1700-*b* is the corresponding ground truth 8-NEX image. Image 1700-*c* was obtained from image 1700-*a* using 2D DnCNN; image 1700-*d* using 3D DnCNN; image 1700-*e* using 2D-multiCH according to an embodiment; and image 1700-*f* using 3D-multiCH according to an embodiment. Next to each of images 1700-*a*, 1700-*c*, 1700-d, 1700-*e*, and 1700-*f* is a residual noise map obtained by comparing the image to ground-truth image 1700-*b*. As can be seen, 2D-multiCH or 3D-multiCH reduces residual noise compared to 2D DnCNN or 3D DnCNN.

FIGS. 18 and 19 are tables 1800, 1900 showing performance metrics for various denoising methods applied to real MR images. Table 1800 shows the 2D PSNR and SSIM metrics for axial, coronal, and sagittal slices, and table 1900 shows the 3D PSNR and SSIM metrics. As in other analyses described herein, the 2D-multiCH and 3D-multiCH outperform 2D and 3D DnCNN. Table 1800 indicates that the 3D-multiCH can facilitate in-plane denoising, likely due to inter-slice redundancy of 3D MR images. When the 3D kernel convolves with a cube, features are extracted from a 3D receptive field. The denoised output of each pixel is determined based on all surrounding pixels within this 3D region. As 3D MRI is intrinsically redundant in the through-plane the abundant information within the 3D receptive field can be reintegrated to yield a better evaluation. Table 1900 shows performance metrics for 3D cubes. All four models provided denoising, and the performance of 3D models exceeds their 2D counterparts, due in part to spatial features extracted by 3D convolutions that are not extractable by 2D convolutions.

The foregoing examples illustrate various features and benefits that can be obtained using denoising neural network systems according to various embodiments. Those skilled in the art with the benefit of this disclosure will appreciate that the performance of a given implementation depends on numerous details and design parameters that are a matter of choice and that, for a given implementation, empirical testing can be used to fine-tune various design parameters.

Additional Embodiments

While the invention has been described with reference to specific embodiments, those skilled in the art will appreciate that numerous modifications are possible. For example, a relative weighting may be applied to the images to account for differences in scale between the two inputs to the denoising system. To reduce error due to motion between images, various techniques can be applied prior to inputting the images, such as image registration techniques or subtraction of the two images and removal of coherent signal in the subtracted image. The techniques described herein can be extended to multiple-NEX acquisitions with more than two NEX, e.g., by increasing the number of images input to the denoising system. Further, as noted above, a single input image, such as an average of NEX images, can be used.

In examples described above, 3D FSE MRI acquisitions were used for imaging of knee joints. Those skilled in the art with the benefit of this disclosure will appreciate that denoising networks according to embodiments of the invention can be applied to any 3D FSE acquisitions, not limited to knees or joints. In addition, denoising system of the kind described herein can be applied to other MRI acquisition methods that use multi-NEX. For example, images obtained using 2D FSE acquisition can be analyzed using a 2D implementation of a denoising system of the kind described herein. Other MRI protocols can also be used, provided that averaging of the images can be used in a residual-learning network of the kind described herein.

Where the acquisition protocol uses multi-NEX, denoising using denoising system 300 incurs no scan-time penalty. For acquisition protocols with 1-NEX, a 2-NEX scan can be implemented using two repeated 1-NEX scans with protocol optimization to control the scan time. In some acquisition protocols such as FSE, the pulse sequence parameters can be adjusted to achieve a tradeoff between scan time and SNR. For example, the scan time can be reduced by increasing the echo train length (i.e., the number of refocusing RF pulses in one train). However, increasing echo train length may increase image blurring. To mitigate this effect, the flip angle train can be designed to reduce blurring (e.g., by reducing the minimum refocusing flip angle). Train duration can also be reduced by increasing the readout bandwidth, which can reduce image blurring resulting from the increased echo train length. In addition, scan time can be reduced by performing greater undersampling of the k-space, with the tradeoff being reduced SNR. In general, the scan-time penalty of 2-NEX relative to 1-NEX involves a tradeoff with an SNR penalty. It is noted that in any event, denoising using a CNN of the kind described herein can provide a much higher SNR than the sum of 2-NEX images; thus adverse effects on SNR of reducing scan time can be mitigated at least to some extent. In some embodiments, use of 2-NEX acquisition with techniques described herein can also improve the denoising performance compared to 1-NEX image with equivalent acquisition time.

In some embodiments, the CNN can be optimized to improve computational efficiency. For example, in a 3D CNN, techniques such as groupwise convolutions or depthwise separable convolutions, which reduce computational load, can be used. Other optimizations can also be implemented. Those skilled in the art with access to this disclosure will appreciate that empirical tuning and optimization of different network parameters can improve performance and that ablative or other analyses can be performed to assess the effect of various parameter choices.

In some embodiments, image analysis operations as described above can be performed in the same computer system that performs image acquisition (e.g., as described with reference to FIG. 1). In other embodiments, distributed computing systems can be used, and image data acquired using an image acquisition system (e.g., as described above with reference to FIG. 1) can be transferred to a different computer system for analysis. It should be understood that a computer system can include hardware components of generally conventional design (e.g., processors, memory and/or other storage devices, user interface components, network interface components) and that program code or other instructions can be provided to the computer system to cause the system to perform computations and/or other processes implementing embodiments described herein or aspects thereof.

Techniques described herein can be implemented by suitable programming of general-purpose computers. A general-purpose computer can include a programmable processor (e.g., one or more microprocessors including a central processing unit (CPU) and one or more co-processors such as graphics processing units (GPUs), or other co-processors optimized to implement nodes of a deep neural network) and memory to store instructions and data used by the programmable processor. A general-purpose computer can also include user interface components such as a display, speakers, keyboard or keypad, mouse, touch pad, track pad, joystick, touch screen, microphone, etc. A general-purpose computer can also include data communication interfaces to transmit data to other computer systems and/or receive data from other computer systems; examples include USB ports; Ethernet ports; other communication ports to which electrical and/or optical signal wires can be connected; and/or antennas and supporting circuitry to implement wireless communication protocols such as Wi-Fi, Bluetooth, NFC (near-field communication), or the like. In some embodiments, a computer system includes a single computer apparatus, where various subsystems can be components of the computer apparatus. The computer apparatus can have a variety of form factors including, e.g., a laptop or tablet computer, a desktop computer, etc. A computer system may include a monitor, printer or other suitable display for providing any of the results mentioned herein to a user. In other embodiments, a computer system can include multiple computer apparatuses, each being a subsystem, with internal components. A computer system can include a plurality of components or subsystems, e.g., connected together by external interface or by an internal interface. In some embodiments, computer systems, subsystems, or apparatuses can communicate over a network. For instance, a computer system can include a server with massive processing power to implement deep neural networks and a client that communicates with the server, providing instructions for specific network structures and operations.

It should be understood that any of the embodiments of the present invention can be implemented in the form of control logic using hardware (e.g., an application specific integrated circuit or field programmable gate array) and/or using computer software with a programmable processor in a modular or integrated manner. As used herein a processor includes a single-core processor, multi-core processor on a same integrated chip, or multiple processing units on a single circuit board or networked. Based on the disclosure and teachings provided herein, a person of ordinary skill in the art will know and appreciate other ways and/or methods to implement embodiments of the present invention using hardware and a combination of hardware and software.

Any of the software components or functions described in this application may be implemented as software code to be executed by a processor using a programming platform such as MATLAB, or any suitable computer language such as, for example, Java, C, C++, C#, Objective-C, Rust, Golang, Swift, or scripting language such as Perl, Python, or PyTorch, using, for example, conventional or object-oriented techniques. The software code may be stored as a series of instructions or commands on a computer readable storage medium; suitable media include random access memory (RAM), a read only memory (ROM), a magnetic medium such as a hard-drive or a floppy disk, or an optical medium such as a compact disk (CD) or DVD (digital versatile disk), flash memory, and the like. The computer readable storage medium may be any combination of such storage devices or other storage devices capable of retaining stored data. Computer readable storage media encoded with the program code may be packaged with a compatible device or provided separately from other devices. Any such computer readable storage medium may reside on or within a single computer product (e.g. a hard drive, a CD, or an entire computer system), and may be present on or within different computer products within a system or network.

Such programs may also be encoded and transmitted using carrier signals adapted for transmission via wired, optical, and/or wireless networks conforming to a variety of protocols, including the Internet. As such, a computer readable transmission medium (which is distinct from a computer readable storage medium) may be created using a data signal encoded with such programs.

Any of the methods described herein may be totally or partially performed with a computer system including one or more processors, which can be configured to perform the steps. Thus, embodiments can involve computer systems configured to perform the steps of any of the methods described herein, potentially with different components performing a respective step or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, circuits, or other means for performing these steps.

The specific details of particular embodiments may be combined in any suitable manner without departing from the spirit and scope of embodiments of the invention. However, other embodiments of the invention may be involve specific embodiments relating to each individual aspect, or specific combinations of these individual aspects.

The above description is illustrative and is not restrictive. Many variations of the invention will become apparent to those skilled in the art upon review of the disclosure. The scope of patent protection should, therefore, be determined not with reference to the above description, but instead should be determined with reference to the following claims along with their full scope or equivalents.

What is claimed is:

1. A method for generating a magnetic resonance (MR) image, the method comprising:

obtaining a set of input images from a magnetic resonance imaging (MRI) system wherein the input images are obtained using a multi-NEX (Number of EXcitations) or multi-NSA (Number of Signal Averages or Acquisitions) protocol and the set of input images includes a number of images equal to the number of NEX or NSA;

inputting the set of images to a denoising neural network that has been trained to perform denoising on a set of input images, wherein the denoising neural network includes two stages of residual learning wherein:

in a first stage, a first residual difference map is calculated and a skip connection is built on the average of the set of input images, thereby producing an intermediate residual-learning output map; and in a second stage, features extracted from all of the input images and the intermediate residual-learning output map are used to generate a second residual difference map; and obtaining a denoised output image from the denoising neural network, wherein the denoised output image is obtained from the second residual difference map and the intermediate residual-learning output map.

2. The method of claim 1 wherein the NEX or NSA is exactly two and the set of images includes exactly two images.

3. The method of claim 1 wherein the NEX or NSA is greater than two and the set of images includes more than two images.

4. The method of claim 1 wherein the input images are two-dimensional (2D) images and the denoising neural network includes a convolutional neural network with one or more 2D kernels.

5. The method of claim 1 wherein the input images are three-dimensional (3D) images and the denoising neural network includes a convolutional neural network with one or more 3D kernels.

6. The method of claim 1 wherein the input images are complex-valued images and the denoising neural network processes the real and imaginary parts of each input image as separate channels.

7. The method of claim 1 further comprising training the denoising neural network using a training data set comprising real MR images with different signal-to-noise ratios.

8. The method of claim 7 wherein the training data set includes training images obtained using 2-NEX acquisitions and corresponding ground truth images obtained using multi-NEX acquisitions with NEX greater than 2.

9. The method of claim 8 wherein the ground truth images have NEX at least equal to 8.

10. The method of claim 1 wherein the images are complex-valued images and the real and imaginary parts of each image are processed as separate channels in the denoising neural network.

11. A magnetic resonance imaging (MRI) system comprising:

an MRI apparatus having a magnet, a gradient coil, and one or more radiofrequency (RF) coils; and a computer communicably coupled to the MRI apparatus, the computer having a processor, a memory, and a user interface, the processor being configured to:

obtain a set of input images from the magnetic resonance imaging (MRI) apparatus, wherein the input images are obtained using a multi-NEX (Number of EXcitations) or multi-NSA (Number of Signal Averages or Acquisitions) protocol and the set of input images includes a number of images equal to the number of NEX or NSA;

input the set of images to a denoising neural network that has been trained to perform denoising on a set of input images, wherein the denoising neural network includes two stages of residual learning wherein:

in a first stage, a first residual difference map is calculated and a skip connection is built on an average of the set of input images, thereby producing an intermediate residual-learning output map; and in a second stage, features extracted from all of the input images and the intermediate residual-learning output map are used to generate a second residual difference map; and obtain a denoised output image from the denoising neural network, wherein the denoised output image is obtained from the second residual difference map and the intermediate residual-learning output map.

12. The system of claim 11 wherein the denoising neural network includes:

a feature extraction module comprising a first plurality of convolutional layers that generate a first feature map from the input images;

a transporting convolutional layer that operates on the first feature map to produce a noise feature map;

a first residual convolutional layer that operates on the first feature map to produce a first-stage residual difference map;

a first skip connection built by combining the first-stage residual difference map with an average image generated from the set of input images to produce an intermediate residual-learning output;

one or more feature mapper convolutional layers that operate on the intermediate residual-learning output to produce a residual filter feature map;

a consolidation layer that consolidates the noise feature map and the residual filter feature map;

a plurality of convolutional layers that operate on an output of the consolidation layer to produce a second-stage residual difference image; and a second skip connection built by combining the second-stage residual difference image and the intermediate residual-learning output to produce the denoised output image.

13. The system of claim 11 wherein the denoising neural network has been trained using a training data set comprising training images with a first signal-to-noise ratio and corresponding ground-truth images with a higher signal-to-noise ratio.

14. The system of claim 11 wherein the processor is further configured to acquire the images by operating the MRI apparatus to perform a three-dimensional Fast Spin Echo acquisition.

15. The system of claim 11 wherein the processor is further configured to acquire the images by operating the MRI apparatus to perform a rapid low-signal-to-noise-ratio multi-NEX acquisition.

16. A computer-readable storage medium having stored thereon program code instructions that, when executed by a processor in a computer communicably coupled to a magnetic resonance imaging (MRI) apparatus, cause the processor to perform a method comprising:

obtaining a set of input images from a magnetic resonance imaging (MRI) system wherein the input images are obtained using a multi-NEX (Number of EXcitations)

or multi-NSA (Number of Signal Averages or Acquisitions) protocol and the set of input images includes a number of images equal to the number of NEX or NSA;

inputting the set of images to a denoising neural network that has been trained to perform denoising on a set of input images, wherein the denoising neural network includes two stages of residual learning wherein:

in a first stage, a first residual difference map is calculated and a skip connection is built on an average of the set of input images, thereby producing an intermediate residual-learning output map; and in a second stage, features extracted from all of the input images and the intermediate residual-learning output map are used to generate a second residual difference map; and obtaining a denoised output image from the denoising neural network, wherein the denoised output image is obtained from the second residual difference map and the intermediate residual-learning output map.

17. The computer-readable storage medium of claim 16 wherein the NEX or NSA is exactly two and the set of images includes exactly two images.

18. The computer-readable storage medium of claim 16 wherein the NEX or NSA is greater than two and the set of images includes more than two images.

19. The computer-readable storage medium of claim 16 wherein the input images are two-dimensional (2D) images and the denoising neural network includes a convolutional neural network with one or more 2D kernels.

20. The computer-readable storage medium of claim 16 wherein the input images are three-dimensional (3D) images and the denoising neural network includes a convolutional neural network with one or more 3D kernels.

21. The computer-readable storage medium of claim 16 wherein the input images are complex-valued images and the denoising neural network processes the real and imaginary parts of each input image as separate channels.

22. The computer-readable storage medium of claim 16 further comprising training the denoising neural network using a training data set comprising real MR images with different signal-to-noise ratios.

23. The computer-readable storage medium of claim 22 wherein the training data set includes training images obtained using 2-NEX acquisitions and corresponding ground truth images obtained using multi-NEX acquisitions with NEX greater than 2.

24. The computer-readable storage medium of claim 16 wherein the images are complex-valued images and the real and imaginary parts of each image are processed as separate channels in the denoising neural network.

* * * * *